(12) United States Patent
Onishi et al.

(10) Patent No.: US 8,753,790 B2
(45) Date of Patent: Jun. 17, 2014

(54) SELF-IMAGEABLE FILM FORMING POLYMER, COMPOSITIONS THEREOF AND DEVICES AND STRUCTURES MADE THEREFROM

(75) Inventors: Osamu Onishi, Tokyo (JP); Haruo Ikeda, Tokyo (JP); Larry Rhodes, Silver Lake, OH (US); Paul Evans, Allston, MA (US); Edmund Elce, Lakewood, OH (US); Andrew Bell, Lakewood, OH (US); Chad Brick, Broadview Hts, OH (US); Hendra Ng, Highlands Heights, OH (US); Pramod Kandanarachchi, Brecksville, OH (US)

(73) Assignee: Promerus, LLC, Brecksville, OH (US)

( * ) Notice: Subject to any disclaimer, the term of this patent is extended or adjusted under 35 U.S.C. 154(b) by 331 days.

(21) Appl. No.: 12/803,602

(22) Filed: Jun. 30, 2010

(65) Prior Publication Data

US 2011/0104614 A1  May 5, 2011

Related U.S. Application Data

(60) Provisional application No. 61/222,366, filed on Jul. 1, 2009, provisional application No. 61/286,195, filed on Dec. 14, 2009.

(51) Int. Cl.
*G03F 7/016* (2006.01)
*G03F 7/021* (2006.01)
*G03F 7/30* (2006.01)

(52) U.S. Cl.
USPC ......... 430/192; 430/190; 430/191; 430/193; 430/311; 430/325; 430/326

(58) Field of Classification Search
None
See application file for complete search history.

(56) References Cited

U.S. PATENT DOCUMENTS

| | | | |
|---|---|---|---|
| 3,517,071 A | | 6/1970 | Caldwell, et al. |
| 5,017,727 A | * | 5/1991 | Olivier .......................... 568/719 |
| 5,554,664 A | | 9/1996 | Lamannal et al. |
| 5,574,118 A | * | 11/1996 | Olivier .......................... 526/281 |
| 6,147,177 A | * | 11/2000 | Jayaraman et al. ............ 526/281 |
| 6,455,650 B1 | | 9/2002 | Lipian et al. |
| 6,794,459 B2 | * | 9/2004 | Jayaraman et al. ......... 525/328.8 |
| 7,022,790 B2 | | 4/2006 | Elcel et al. |
| 7,524,594 B2 | | 4/2009 | Amoroso et al. |
| 2006/0008734 A1 | * | 1/2006 | Amoroso et al. ........... 430/270.1 |
| 2012/0129101 A1 | * | 5/2012 | Onishi et al. ............... 430/283.1 |

OTHER PUBLICATIONS

R. Dammel, "Diazonaphthoquinone-based Resists", 1993, p. 51.
L. F. Thompson, C. G. Willson and M.J. Bowden, "Organic Resist Materials", Introduction to Microlithography, 1994, pp. 212-232.
H. Ito, "Dissolution behavior of chemically amplified resist polymers for 248-, 193-, and 157-nm lithography", IBM J. Res. & Dev., 2001, vol. 45(5), pp. 683-695.
Rao et.al., "Dissolution Fundamentals of 193-nm Methacrylate Based Photoresists", Proc. of SPIE, 2006, vol. 6153, pp. 615310-1-7.
Varanasi, et.al, "193nm Single Layer Photoresists: Defeating Tradeoffs with a New Class of Fluoropolymers", Proc. of SPIE, 2005, vol. 5753, pp. 131-139.

\* cited by examiner

*Primary Examiner* — Cynthia Hamilton
(74) *Attorney, Agent, or Firm* — Balaram Gupta; Michael W. Ferrell

(57) ABSTRACT

Embodiments in accordance with the present invention encompass self-imageable film forming compositions that comprise norbornene-type polymers and that can be formulated to be either positive tone imaging or negative tone. The films formed thereby are useful in the forming of microelectronic and optoelectronics devices.

14 Claims, 8 Drawing Sheets

SELF-IMAGEABLE FILM FORMING POLYMER, COMPOSITIONS THEREOF AND DEVICES AND STRUCTURES MADE THEREFROM

CROSS-REFERENCE TO RELATED APPLICATIONS

This application claims the benefit of priority to U.S. Provisional Application Ser. No. 61/222,366 filed Jul. 1, 2009 and U.S. Provisional Application Ser. No. 61/286,195 filed Dec. 14, 2009, the entire contents of each are hereby incorporated by reference.

TECHNICAL FIELD

The present invention relates generally to norbornene-type polymers useful in compositions for forming self-imageable films and more specifically to such polymers that encompass repeating units that have phenolic functionality for providing self-imageability when a film is imagewise exposed to actinic radiation.

BACKGROUND

For many years, semiconductor photolithography employed negative tone photopolymers based on the photochemical crosslinking of cyclized poly(isoprene) with bis (arylazide). However, as device geometries became smaller, swelling issues during the solvent development of such resists became increasingly problematic prompting the development of positive tone photopolymers based on diazonaphthoquinone (DNQ)/novolaks. These new photoresists employed an aqueous base solution instead of solvent to develop the image and exhibited essentially no swelling. Thus such photopolymers provided the enhanced image resolution needed to support more advanced semiconductor device fabrication into the mid 1990's (Diazonaphthoquinone-based Resists by R. Dammel, 1993, p. 51).

However, as the industry saw the requirement for geometries that could not be achieved with long wavelength mercury vapor illumination and advanced exposure tools were developed that employed shorter and shorter wavelengths. As these wavelengths approached the deep UV (KrF or 248 nm radiation) the aforementioned DNQ/novolak system was found to be too absorbing and new photopolymers based on poly(hydroxystyrene) (PHS) and chemical amplification strategies were developed leading to transparent, highly sensitive resists (Introduction to Microlithography by L. F. Thompson, C. G. Willson and M. J. Bowden, 1994, p. 212-232 and H. Ito, IBM J. Res. Dev., 2001, 45(5) 683).

Both the DNQ/novolak and PHS systems encompass acidic phenol functionality that is deprotonated by aqueous base, in areas exposed to the actinic radiation, during the image development process thus rendering the resulting ionomer soluble and providing a positive image. Further, it is known that both novolaks and PHS polymers dissolve smoothly in aqueous base developer with minimal swelling (Rao, A. et al. Proc. SPIE, 2006, 6153, 615310-1 and Varanasi, et al. Proc. SPIE, 2005, 5753, 131, respectively).

The use of norbornene-type polymers for forming self-imageable films that are useful for forming structures in microelectronic and optoelectronic devices has also been known (see for example, U.S. Pat. No. 7,022,790). However, such structure forming self-imageable films have generally been limited the use of a solvent based image development process thus limiting both their applicability and use. Given that both the novolak and PHS systems described above successfully incorporate acidic phenol functionality to provide imageability using the industry standard aqueous base development system (0.26N TMAH) for photoresist compositions, it was believed such acidic phenol functionally could be used in a norbornene-type polymer to provide imaging via an aqueous base development system. However, when films of a norbornene-type polymer containing the essentially identical aqueous base solubilizing functionality of the novolak and PHS systems were immersed in a 0.26 N TMAH solution, the smooth, linear dissolution properties expected were not observed. Rather, the polymer film appeared to be insoluble as peeling of the film was generally observed rather than dissolution thus leaving a residue on the wafer.

As it is believed that aqueous developable norbornene-type film forming polymers and compositions formed thereof will be advantageous for microelectronic and optoelectronic devices, providing such polymers and/or polymer compositions would be useful. Thus solving the aforementioned solubility problems with norbornene-type polymer systems and the creation of polymer compositions and their use is described hereinafter.

BRIEF DESCRIPTION OF THE DRAWING

Embodiments in accordance with the present invention are described below with reference to the following accompanying drawings:

FIGS. 8a and 8b are photomicrographs of 5 μm lines and spaces in accordance with Imaging Example E2a;

FIG. 4a is a piece after post-exposure bake and develop while FIGS. 4b-4d are pieces further subjected to heating for three minutes on a hot plate to 220° C., 250° C. and 280° C., respectively;

DETAILED DESCRIPTION

Figure 1:
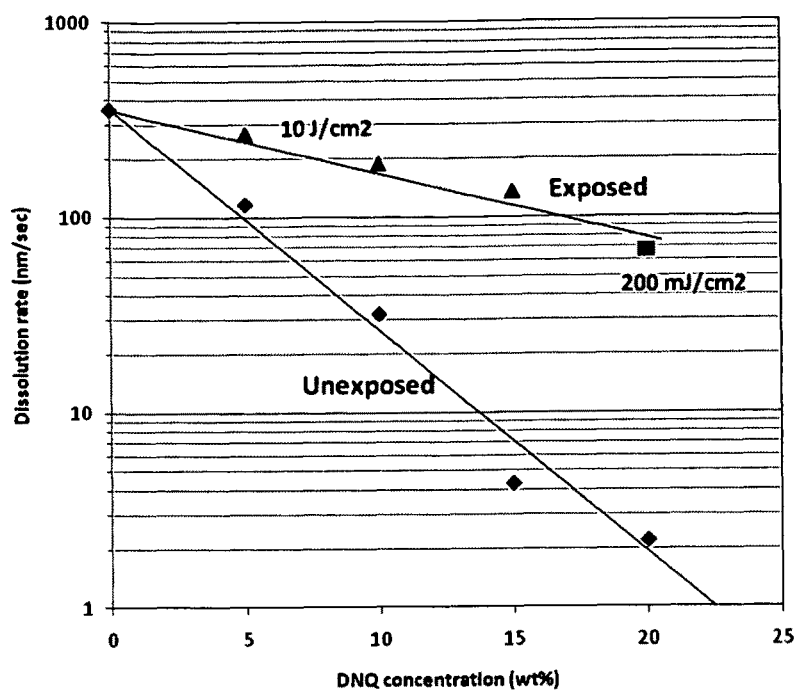
FIGS. 1, 2, 3, 4, 5 and 6 are Meyerhofer Plots of the data shown in Tables 2, 3, 4, 5, 6 and 7, respectively.
Figure 2:
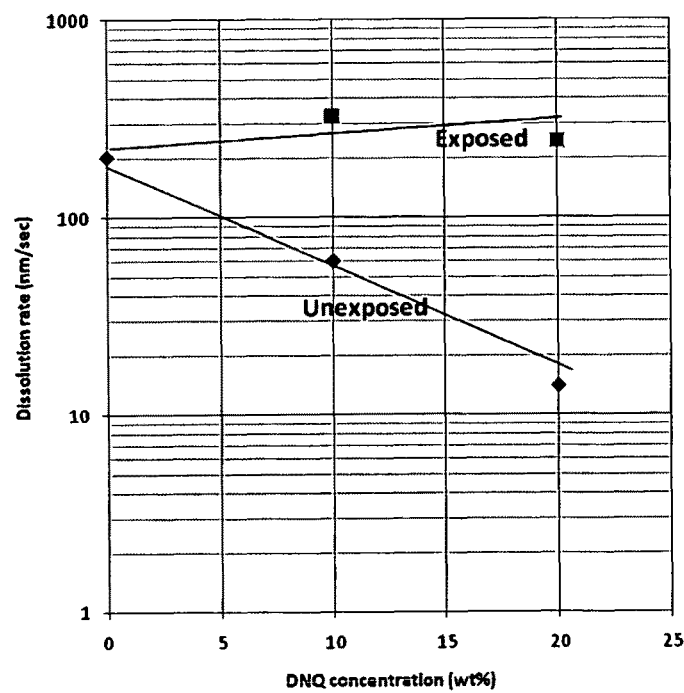
Figure 3:
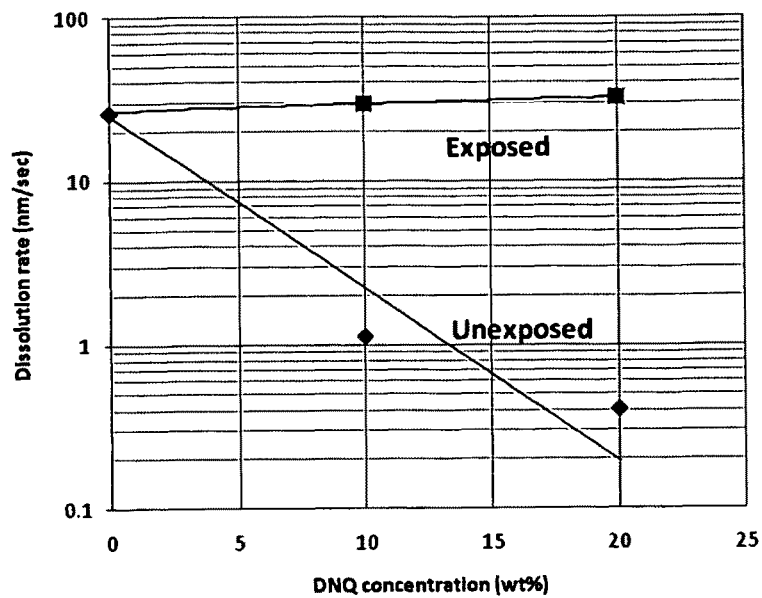
Figure 4:
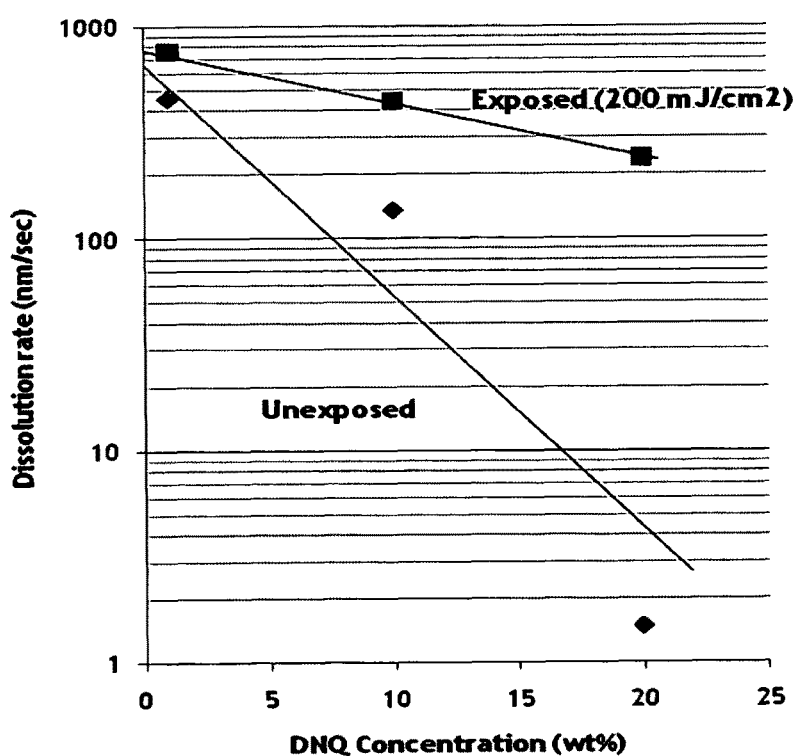
Figure 5:
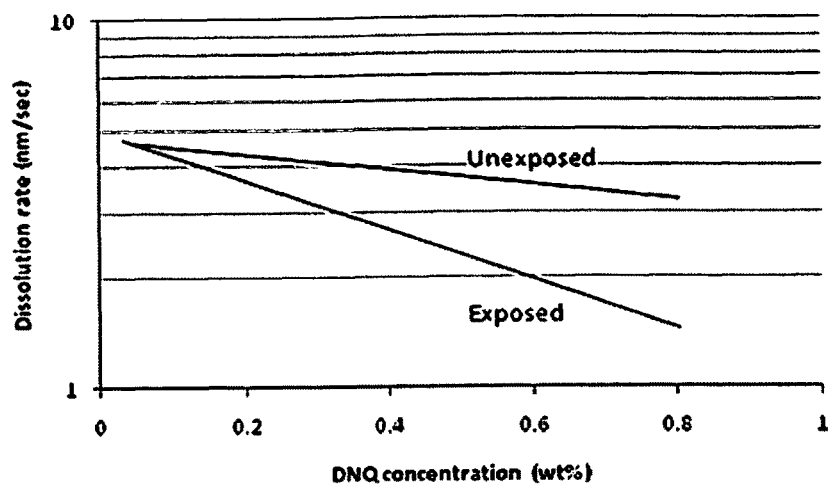
Figure 6:
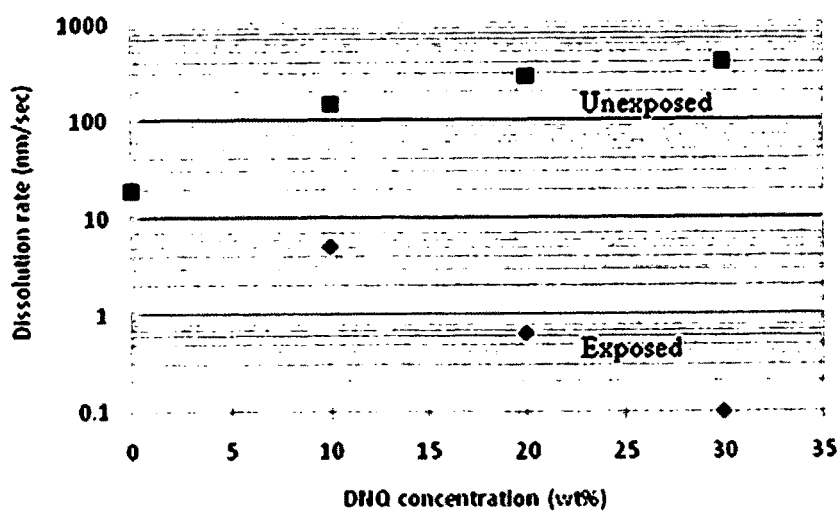

Embodiments in accordance with the present invention are directed to providing polycyclic olefin polymer compositions, such as norbornene-type polymer compositions that are capable of forming films for use in microelectronic and optoelectronic devices. Advantageously, such films are self-imageable, that is to say that when image-wise exposed to actinic radiation, such films can be developed to form a patterned film, where such pattern is positively reflective of the image through which the film was exposed and thus provide structures that are or are to become a part of such microelectronic and/or optoelectronic devices.

Unless otherwise indicated, all numbers, values and/or expressions referring to quantities of ingredients, reaction conditions, etc., used herein are to be understood as modified in all instances by the term "about" as absent the aforementioned indication, such numbers are approximations reflective of, among other things, the various uncertainties of measurement encountered in obtaining such values. Further, where a numerical range is disclosed herein such range is continuous, and includes every value between the minimum and maximum values of such range. Still further, where a range refers to integers, every integer between the minimum and maximum values of such range is included. In addition, where multiple ranges are provided to describe a feature or characteristic, such ranges can be combined.

As used herein, the term "polymer composition" is meant to include one or more synthesized polymers, as well as residues from initiators, catalysts and other elements attendant to the synthesis of such polymer(s), where such residues are understood as not being covalently incorporated thereto. Such residues and other elements considered as part of the polymer composition are typically mixed or co-mingled with the polymer(s) such that they tend to remain with therewith when it is transferred between vessels or between solvent or dispersion media. A polymer composition can also include materials added after synthesis of the polymer(s) to provide or modify specific properties of such composition.

As used herein, "hydrocarbyl" refers to a radical of a group that contains only carbon and hydrogen, non-limiting examples being alkyl, cycloalkyl, aryl, aralkyl, alkaryl, and alkenyl. The term "halohydrocarbyl" refers to a hydrocarbyl group where at least one hydrogen has been replaced by a halogen. The term perhalocarbyl refers to a hydrocarbyl group where all hydrogens have been replaced by a halogen.

As used herein, "alkyl" refers to a linear or branched acyclic or cyclic, saturated hydrocarbon group having a carbon chain length of, for example, from appropriate $C_1$ to $C_{25}$ groups. Non-limiting examples of suitable alkyl groups include, but are not limited to, —$(CH_2)_3CH_3$, —$(CH_2)_4CH_3$, —$(CH_2)_5CH_3$, —$(CH_2)_9CH_3$, —$(CH_2)_{23}CH_3$, cyclopentyl and cyclohexyl.

As used herein the term "aryl" refers to aromatic groups that include, without limitation, groups such as phenyl, biphenyl, benzyl, xylyl, naphthalenyl, anthracenyl and the like.

The terms "alkaryl" or "aralkyl" are used herein interchangeably and refer to a linear or branched acyclic alkyl group substituted with at least one aryl group, for example, phenyl, and having an alkyl carbon chain length of $C_1$ to $C_{25}$. It will further be understood that the above acyclic alkyl group can be a haloalkyl or perhaloakyl group.

As used herein the term "alkenyl" refers to a linear or branched acyclic or cyclic hydrocarbon group having one or more double bonds and having an alkenyl carbon chain length of $C_2$ to $C_{25}$. Non-limiting examples include, among others, vinyl groups, propylene, butenes and the like.

As used herein the term "heterohydrocarbyl" to any of the previously described hydrocarbyls, halohydrocarbyls and perhalohydrocarbyls where at least one carbon of the carbon chain is replaced with N, O, S, Si or P. Non-limiting examples include heterocyclic aromatic groups such as pyrrolyl, furanyl, and the like, as well as non-aromatic groups such as ethers, thioethers and silyl ethers. The term "alkylol" refers to alkyl groups that include one or more hydroxyl groups.

It will additionally be understood that any of the hydrocarbyl, halohydrocarbyl and perhalohydrocarbyl moieties described above can be further substituted, if desired. Non-limiting examples of suitable substituent groups include, among others, hydroxyl groups, benzyl groups, carboxylic acid and carboxylic acid ester groups, amides and imides.

Embodiments in accordance with the present invention are suitable for the preparation of polymers encompassing a wide range of norbornene-type repeating units. As defined herein, the terms "polycycloolefin", "poly(cyclic) olefin", and "norbornene-type" are used interchangeably and refer to addition polymerizable monomers (or the resulting repeating unit), that encompass at least one norbornene moiety such as shown below:

The simplest norbornene-type or poly(cyclic) olefin monomer encompassed by embodiments in accordance with the present invention is the bicyclic monomer, bicyclo[2.2.1]hept-2-ene, commonly referred to as norbornene. However, the term norbornene-type monomer or repeating unit is used herein to mean norbornene itself as well as any substituted norbornene(s), or substituted and unsubstituted higher cyclic derivatives thereof. Formula I, shown below, is representative of such norbornene monomers:

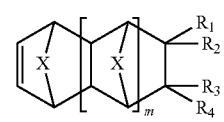

where X is selected from —$CH_2$—, —$CH_2$—$CH_2$, O and S; m is an integer from 0 to 5 and each occurrence of $R^1$, $R^2$, $R^3$ and $R^4$ independently represents hydrogen, a hydrocarbyl or another substituent.

Useful monomers for embodiments in accordance with the present invention are described generally above and below, and further described by the monomer and substituent structures provided herein. With regard to the polymer composition embodiments of the present invention, it will be noted that such compositions can encompass a single polymer having at least two repeating units derived from the aforementioned monomers, or a blend of two or more polymers where one or more of such blended polymers can be a homopolymer; such blended polymer also having repeating units derived from the aforementioned monomers.

It will be understood that such monomers form polymers via a polymerization reaction that results in the 2,3-enchainment of such monomers via a metal catalyzed addition reaction often referred to a vinyl addition polymerization. Suitable metal catalysts are generally Pd or Ni containing and they and the polymerization reactions they cause to occur are described in U.S. Pat. No. 6,455,650 and U.S. Pat. No. 6,232,417, respectively, the pertinent parts of which are incorporated herein by reference.

When any of $R^1$, $R^2$, $R^3$ and $R^4$ is a hydrocarbyl group, such group can be a $C_1$ to $C_{30}$ alkyl, aryl, aralkyl, alkaryl, alkenyl, alkynyl, cycloalkyl, cycloalkenyl, alkylidenyl or alkylsilyl group. Representative alkyl groups include, but are not limited to, methyl, ethyl, propyl, isopropyl, butyl, isobutyl, sec-butyl, tert-butyl, pentyl, neopentyl, hexyl, heptyl, octyl, nonyl and decyl. Representative alkenyl groups include, but are not limited to, vinyl, allyl, butenyl and cyclohexenyl. Representative alkynyl groups include, but are not limited to, ethynyl, 1-propynyl, 2-propynyl, 1-butynyl and 2-butynyl. Representative cycloalkyl groups include, but are not limited to, cyclopentyl, cyclohexyl and cyclooctyl substituents. Representative aryl groups include, but are not limited to, phenyl, naphthyl and anthracenyl. Representative aralkyl groups include, but are not limited to, benzyl and phenethyl. Representative alkylidenyl groups include methylidenyl and ethylidenyl groups. In addition, it should be noted that the hydrocarbyl groups mentioned above can be substituted, that is to say one of the hydrogen atoms replaced, with $C_1$-$C_{10}$ alkyl, haloalkyl and perhaloalkyl groups, aryl groups and cycloalkyl groups.

Any of $R^1$ to $R^4$ can also be a halohydrocarbyl group, where such group includes any of the hydrocarbyls mentioned above where at least one, but less than all, of the hydrogen atoms of the hydrocarbyl are replaced by a halogen (fluorine, chlorine, bromine or iodine). Additionally, any of $R^1$ to $R^4$ can be a perhalocarbyl, where such group includes any of the hydrocarbyls mentioned above where all of the hydrogen atoms of the hydrocarbyl are replaced by a halogen. Useful perfluorinated substituents include perfluorophenyl, perfluoromethyl, perfluoroethyl, perfluoropropyl, perfluorobutyl and perfluorohexyl.

When the pendant group(s) is another substituent, any of $R^1$ to $R^4$ independently represent linear or branched carboxylic acid, carboxylic acid ester, carboxylic acid ether, ether, alcohol and carbonyl groups with the proviso that such groups are not acid labile groups.

Further, in some embodiments in accordance with the present invention, monomers represented in Formula I above, can have $R^1$ and $R^4$ taken together with the two ring carbon atoms to which they are attached represent a substituted or unsubstituted cycloaliphatic group containing 4 to 30 ring carbon atoms or a substituted or unsubstituted aryl group containing 6 to 18 ring carbon atoms or combinations thereof. The cycloaliphatic group can be monocyclic or polycyclic. When unsaturated the cyclic group can contain monounsaturation or multiunsaturation, with monounsaturated cyclic groups being found useful. When substituted, the rings contain monosubstitution or multisubstitution wherein the substituents are independently selected from hydrogen, a $C_1$-$C_5$ alkyl, haloalkyl, alkoxy, halogen, or combinations thereof. The radicals $R^1$ and $R^4$ can be taken together to form the divalent bridging group, —C(O)-G-(O)C—, which when taken together with the two ring carbon atoms to which they are attached form a pentacyclic ring, where G represents an oxygen atom or the group $N(R^{38})$, and $R^{38}$ is selected from hydrogen, halogen, a $C_1$-$C_{10}$ alkyl, and a $C_6$-$C_{18}$ aryl. A representative structure, Formula Ia, is shown in below, where X and m are as previously defined for Formula I.

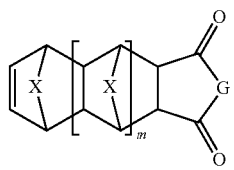

Ia

In some embodiments in accordance with Formula I, the perhalohydrocarbyl groups can include perhalogenated phenyl and alkyl groups. In other embodiments, the perfluorinated substituents can include perfluorophenyl, perfluoromethyl, perfluoroethyl, perfluoropropyl, perfluorobutyl and perfluorohexyl. In addition to the halogen substituents, cycloalkyl, aryl and aralkyl groups of such embodiments can be further substituted with any $C_1$-$C_5$ alkyl and haloalkyl group, aryl groups and cycloalkyl group. Non-limiting examples of monomers in accordance with embodiments of the present invention include those shown below in Monomer Groups AA, BB, CC, DD and EE.

In some other embodiments in accordance with Formula I, the poly(cyclic) olefin monomer includes 5-(2-hydroxy-2,2-bistrifluoromethyl)ethyl-2-norbornene (HFANB), 5-norbornene-2-methanol hydroxylethylether, t-butyl ester of norbornene 5-carboxylic acid, hydroxyethylester of 5-norbornene carboxylic acid, trimethylsilane ester of 5-norbornene carboxylic acid, 5-norbornene-2-methanol acetate, 5-norbornene-2-methanol, 5-norbornene-2-ethanol, 5-triethoxy-silylnorbornene, 1-methylcyclopentyl ester of 5-norbornene carboxylic acid, tetrahydro-2-oxo-3-furanyl ester of 5-norbornene carboxylic acid and mixtures thereof.

In still other embodiments in accordance with Formula I, at least one of $R^1$ to $R^4$ can be a $QNHSO_2R^8$ group or a $Q(CO)O$—$(CH_2)_m$—$R^8$ group, where Q is an optional alkyl or hetero-alkyl spacer of 1 to 5 carbons, m is either 0 or an integer from 1 to 3 inclusive and $R^8$ is a perhalo group of 1 to about 10 carbon atoms. It will be understood that while the chain length for Q is expressed as a number of carbons, where such group is a heteroalkyl, the indicated carbon chain length is inclusive of any heteroatoms that may be present.

In some embodiments in accordance Formula I, at least one of $R^1$ to $R^4$ is one of groups A, B or C:

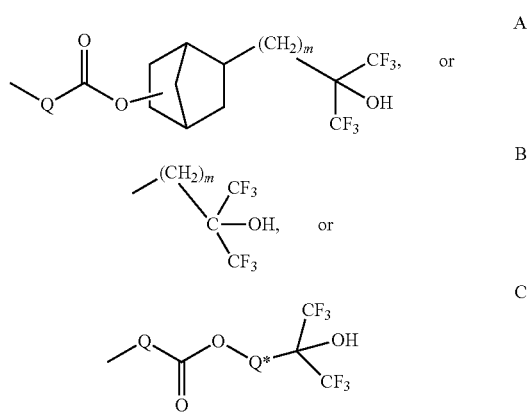

where m and Q are as defined above and Q* is an alkyl spacer of 1 to 5 carbons.

In some embodiments encompassing groups A or C, Q is not present or is a linear alkyl spacer of 1 to 3 carbons and additionally for group C, Q* is an alkyl spacer of 3 or 4 carbons. In other such embodiments, Q is either not present or is 1 carbon atom. In other embodiments encompassing group B, m is either 1 or 2. In exemplary embodiments of the encompassing repeating units represented by Formula I, X is —$CH_2$—, one of $R^1$ to $R^4$ is group B and the others are each hydrogen, n is 0 and m is 1

In yet other embodiments in accordance with Formula I, at least one of $R^1$ to $R^4$ is one of groups D, E or F:

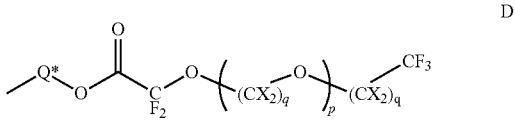

D

-continued

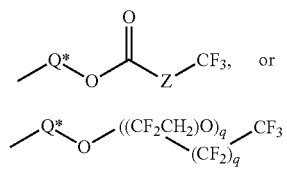

where each X is independently either F or H, each q is independently an integer from 1 to 3, p is an integer from 1 to 5, Q* is as defined above, and Z is a linear or branched halo or perhalo spacer of 2 to 10 carbons.

In some embodiments encompassing group D, Q* is one carbon, X is F, q is 2 or 3 and p is 2. In some embodiments encompassing group E, Q* is one carbon and Z is a branched fluorinated alkyl chain of up to 9 carbons units. In some embodiments encompassing group F, Q* is one carbon and q is 1 or 2.

In other embodiments in accordance with Formula I, at least one of $R^1$ to $R^4$ is a group represented by the formula:

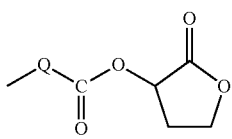

G where Q is an optional alkyl or heteroalkyl spacer where, if present, is as defined above. In some other embodiments the others of $R^1$ to $R^4$ are each hydrogen and Q is not present or is a linear alkyl spacer of 1 to 3 carbons or hetero-atoms. In still other embodiments the others of $R^1$ to $R^4$ are each hydrogen and Q is not present or is 1 carbon atom and in yet still other embodiments, the others of $R^1$ to $R^4$ are each hydrogen and Q is not present.

In other embodiments in accordance with Formula I, at least one of $R^1$ to $R^4$ is a group represented HJK shown below:

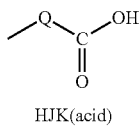

HJK(acid)

where Q is as defined above.

In still other embodiments in accordance with Formula I, at least one of $R^1$ to $R^4$ is a group represented by group L:

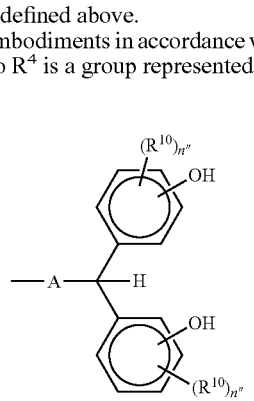

where A is an optional alkyl or cycloalkyl group having from 1 to 6 or 4 to 12 carbons, respectively, if present. Where A is not present, the polycyclic ring(s) are either directly joined with the carbon connecting the phenol moieties, or the phenol moieties are directly joined to a polycyclic ring carbon. Each $R^{10}$ is independently selected from a halogen, a monovalent hydrocarbon, an alkoxy, an aryloxy or an electron withdrawing group such as —CN, —$NO_2$, —$CF_3$ or the like and each n″ is independently an integer from 0 to 4; where such monovalent hydrocarbon is a $C_1$ to $C_6$ alkyl, a $C_6$ to $C_{12}$ aryl or a $C_7$ to $C_{14}$ alkaryl; such alkoxy having from 1 to 6 carbons and such aryloxy from 6 to 12 carbons.

Monomer Group AA

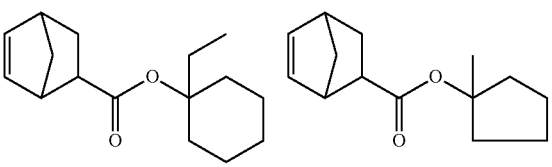

ECHNB  MCPNB

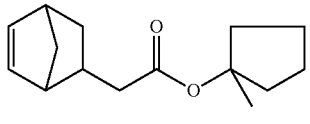

NBCH$_2$MCP

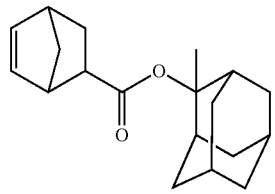

MADNB

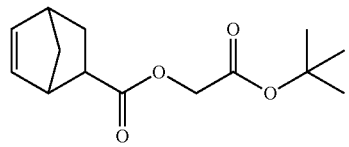

NBCOOBOCME

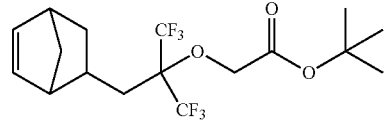

NBHFABOCME

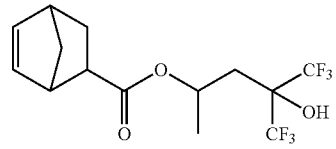

secPrHFAEsNB

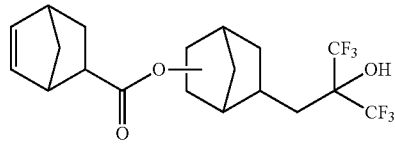

HFANBEsNB

-continued
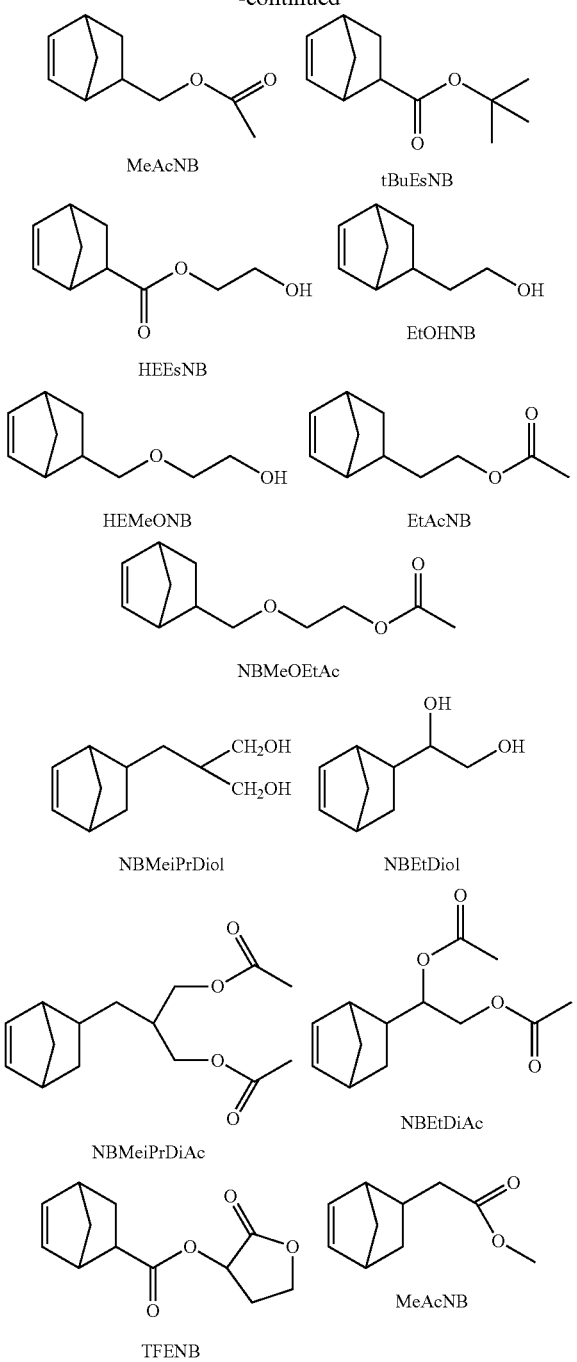
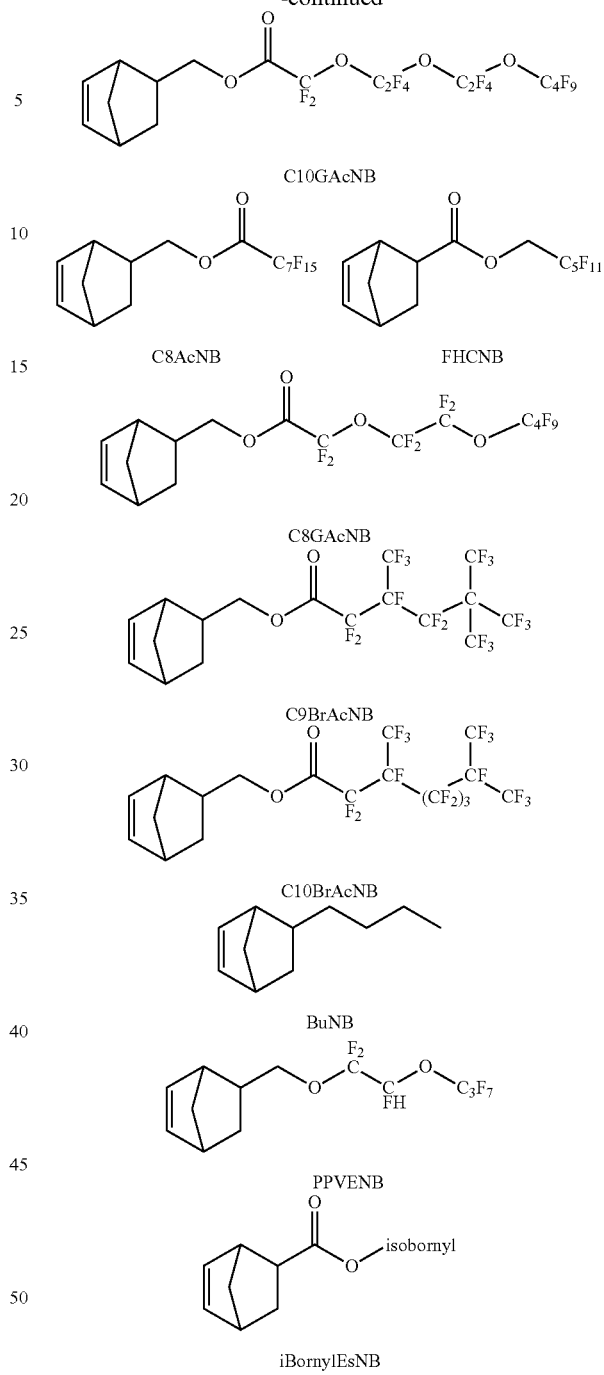
Monomer Group BB
Monomer Group CC
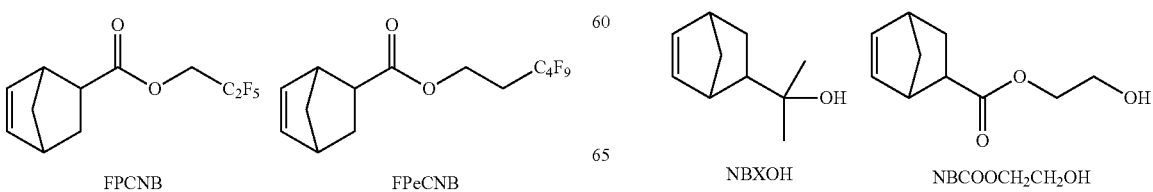

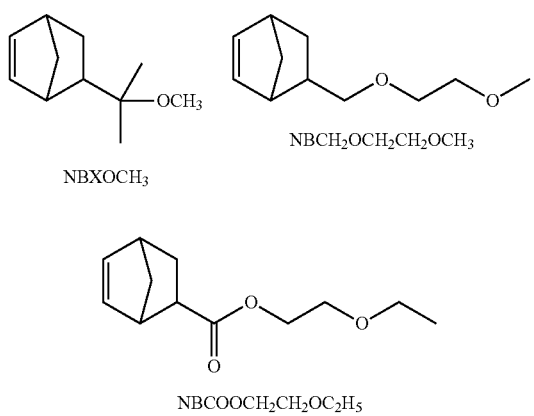
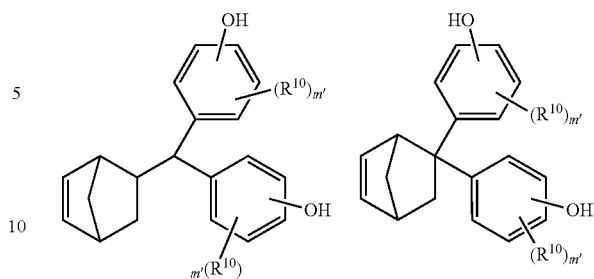
Where $R^{10}$ and $n''$ are as defined above for Group L
Monomer Group EE
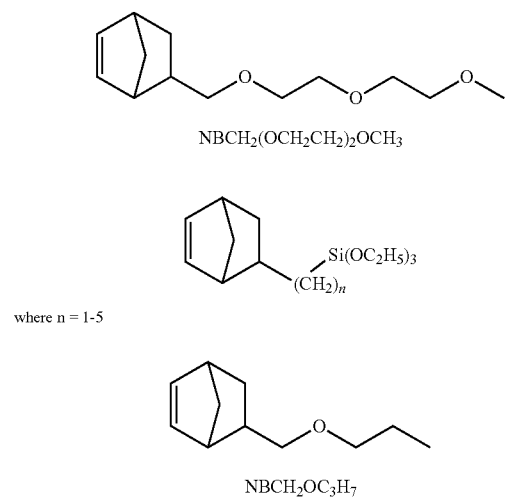
where n = 1-5
Monomer Group DD
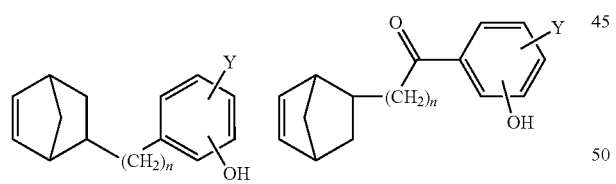
where n = 0-5 and Y is an alkyl, ether or ketone
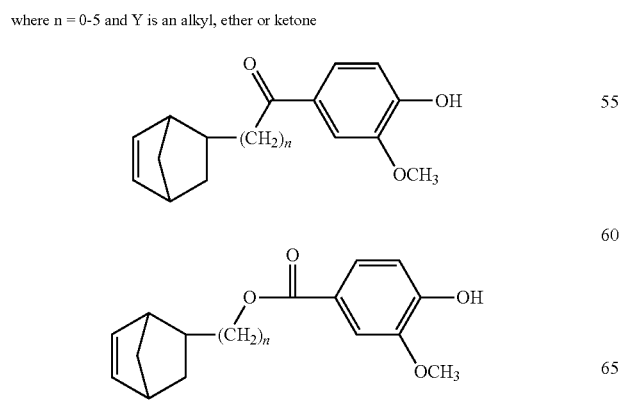
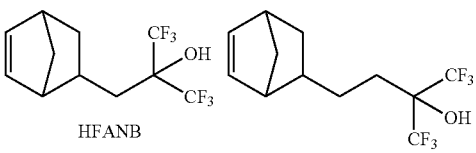
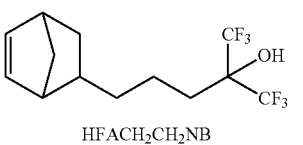
TFSNB
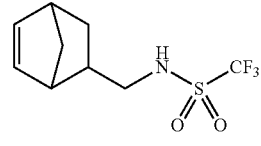
TFSCH₂NB
TFSCH₂CH₂NB
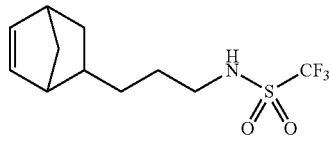
NB(CH₂)ₙMHFP
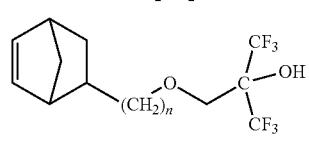
secPrHFAEsNB

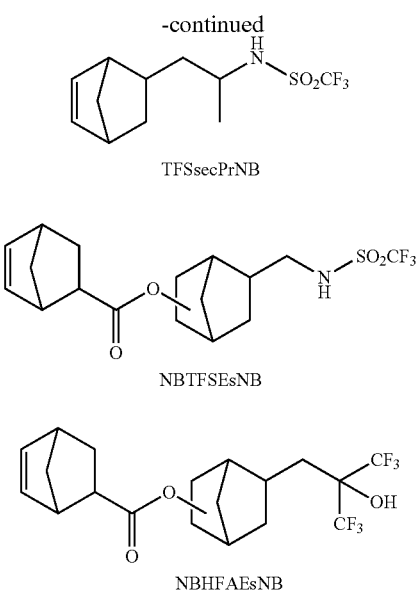

TFSsecPrNB

NBTFSEsNB

NBHFAEsNB

As mentioned above, embodiments in accordance with the present invention are directed to providing norbornene-type polymers and compositions thereof that are useful for forming films for use in microelectronic and optoelectronic devices. Further, such films, once formed are self-imageable, that is to say that when image-wise exposed to actinic radiation, such films can be developed to form a patterned film, where such pattern is positively reflective of the image through which the film was exposed. Advantageously such an imaged film provides structures that are to become a part of such microelectronic and/or optoelectronic devices. For example, such films are useful as planarization layers in liquid crystal displays or as a buffer or redistribution layer in microelectronic devices. Additionally, such films can be employed as sacrificial layers useful for forming airgap structures as well as for forming MEMS (micro-electro-mechanical structure) devices. It will be noted that such examples are only a few of the many uses that such a self-imageable film can provide and do not serve to limit the scope of such films or the polymers and polymer compositions that are used to form them. Accordingly, in some of the embodiments of this invention, there is provided a film forming composition for forming a film having at least one of a transparency of at least 85% at 400 nm, a dielectric constant of 3 or less at 1 MHz, a water uptake of 0.1% or less, or a tolerance to toluene of 0.1% or less, comprising: a first polymer comprising NBPhOH and HFANB repeating units; a casting solvent; a PAC; and an epoxy compound.

Thus embodiments in accordance with the present invention encompass polymers derived from the aforementioned and described monomers via a metal catalyzed polymerization reaction. While, as mentioned above, such reactions can be either Ni or Pd catalyzed, it should be noted that where a monomer encompasses an acidic pendent group, generally such monomers are provided to the polymerization in a protected form. For example, rather than providing 5-phenol-2-norbornene, 5-phenolacetate-2-norbornene is provided to the polymerization charge and hydrolyzed post-polymerization. Not wishing to be bound to a specific theory, it is believed that where the pKa of a pendent group is higher than about 8, a monomer introduced to a polymerization mixture provides better results if such pendent group is protected.

The norbornene-type polymers of embodiments in accordance with the present invention are prepared by addition polymerization using neutral or cationic palladium based catalysts such as set forth in U.S. Pat. No. 6,455,650, or nickel based catalysts as set forth in U.S. Pat. No. 6,232,417. The pertinent parts of these patents are incorporated herein by reference. Exemplary palladium catalysts encompass, among others, trans-[Pd(NCMe)(OAc)(P(i-propyl)$_3$)$_2$]B(C$_6$F$_5$)$_4$, trans-[Pd(NCC(CH$_3$)$_3$)(OAc)(P(i-propyl)$_3$)$_2$]B(C$_6$F$_5$)$_4$, trans-[Pd(OC(C$_6$H$_5$)$_2$)(OAc)(P(i-propyl)$_3$)$_2$]B(C$_6$F$_5$)$_4$, trans-[Pd(HOCH(CH$_3$)$_2$)(OAc)(P(i-propyl)$_3$)$_2$]B(C$_6$F$_5$)$_4$, trans-[Pd(NCMe)(OAc)(P(cyclohexyl)$_3$)$_2$]B(C$_6$F)$_4$, Pd(OAc)$_2$(P(cyclohexyl)$_3$)$_2$, Pd(OAc)$_2$(P(i-propyl)$_3$)$_2$, Pd(OAc)$_2$(P(i-propyl)$_2$(phenyl))$_2$, trans-[Pd(NCMe)(OAc) (P(cyclohexyl)$_2$(t-butyl))$_2$]B(C$_6$F$_5$)$_4$, and mixtures thereof.

Exemplary nickel catalysts encompass, among others, (toluene)bis(perfluorophenyl)nickel, bis(tetrahydrofuran)bis (perfluorophenyl)nickel, (dimethoxyethane)bis(2,4,6-tris (trifluoromethylphenyl)) nickel, bis(dioxane)bis(perfluorophenyl)nickel, bis(ethylacetate)bis(perfluorophenyl)nickel and mixtures thereof.

Upon polymerization, monomers in accordance with Formula I become repeating units in accordance with Formula II:

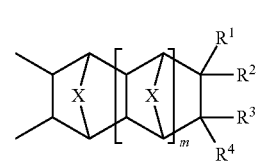

where $R^1$ to $R^4$, X and m are as previously defined for Formula I.

In some embodiments in accordance with the present invention, the polymer composition encompasses a blend of two or more norbornene-type polymers where such polymers can be homopolymers (a polymer having only one type of repeating unit) or copolymers (a polymer having more than one type of repeating unit). In other embodiments of the present invention, the polymer composition encompasses only one norbornene-type polymer where such polymer is a copolymer.

For the aforementioned polymer blend embodiments, the polymer composition encompasses a first polymer having repeating units derived from monomers in accordance with one or more of the monomers depicted in Monomer Group DD, a second polymer having repeating units derived from monomers in accordance with one or more of the monomers depicted in Monomer Group EE. Further such polymer blend embodiments can optionally encompass other polymers having one or more repeating units such as are defined in any of the previously described Monomer Groups as well as any of the monomers in accordance with Formulae I or Ia.

Turning now to embodiments of a polymer composition encompassing a single norbornene-type polymer, such third polymer encompasses at least one repeating unit derived from the monomers depicted in Monomer Group DD and at least one repeating unit derived from the monomers depicted in Monomer Group EE. Further such single norbornene-type polymer embodiments can optionally encompass other one or more other types of repeating units such as are defined in any of the previously described Monomer Groups as well as any of the monomers in accordance with Formulae I or Ia.

Further to the polymer blend and single norbornene-type polymer composition embodiments of the present invention, such compositions also encompass a casting solvent, a Photo Active Compound (PAC) and optionally one of a novolak and a polyhydroxystyrene (PHS) which are believed to enhance the solubility of the polymer composition in aqueous base solutions.

Exemplary casting solvents include, among others, propylene glycol monomethyl ether (PGME), propylene glycol monomethyl ether acetate (PGMEA), ethyl lactate, isobutyl alcohol (IBA), methyl isobutyl carbinol (MIBC), gamma-butyrolactone (GBL) and methyl n-amyl ketone (MAK) and mixtures thereof.

Exemplary PAC's include, but are not limited to, PAC-5570 (St. Jean Photochemicals Inc., Quebec, Canada) and TS200, TS 250, TS300 and 4NT-300 (all from Toyo Gosei Co. Ltd., Chiba, Japan), SCL6 (Secant Chemicals Inc., Winchendon, Mass., USA) the structures of which are provided below:

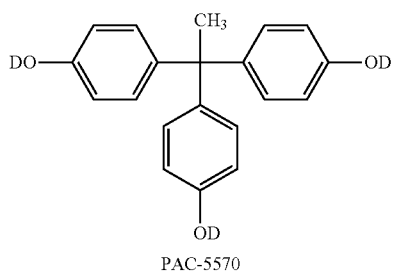
PAC-5570

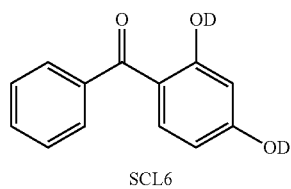
SCL6

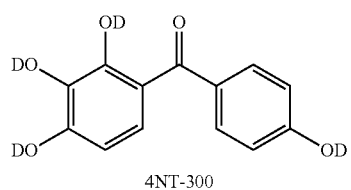
4NT-300

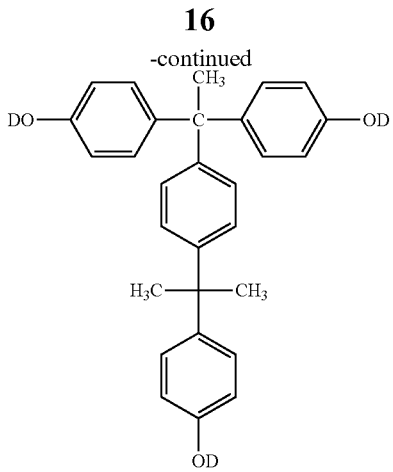

For TS-200, 67% of D is DNQ
For TS-250, 83% of D is DNQ
For TS-300, 100% of D is DNQ where D=H or one of the below:

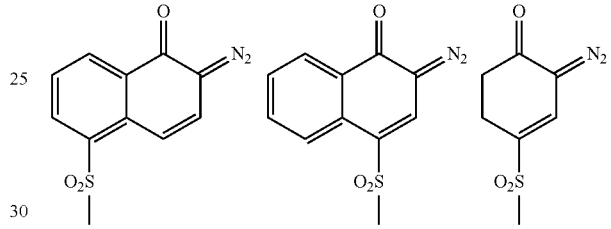

but also include the PACs disclosed in U.S. Pat. No. 7,524,594 beginning at column 13, line 39 and continuing through Collective Formula 9z at column 20. Such portion of the '594 patent is incorporated herein by reference.

Still further, such compositions can encompass crosslinking agents such as epoxies, polyvinyl ethers, glycolurils and oxetanes, among others. More specifically, exemplary crosslinking agents include, but are not limited to, tetrakis (methoxymethyl)glycoluril (Powderlink 1174), 3-methacryloxymethyl-3-ethyloxetane (OXMA) and (4,4'-bis[3-ethyl-3oxetanyl)methoxymethyl]biphenyl) (OXBP) and bis[(3-ethyl-3-oxetanyl)methyl]isophthalate) (OXIPA) all from UBE Industries, Ltd., Japan), a methylated melamine formaldehyde polymer under trade name Cymel 301 (CYTEC INDUSTRIES INC., WOODLAND PARK, NJ, USA as well as LX-1 (Daiso Chemical Co., Osaka, Japan) and CEL2021 [CAS#2386-87-0] or EHPE3150 [CAS#244772-00-7](both from Daicel Chemical Industries, Osaka, Japan) as shown below:

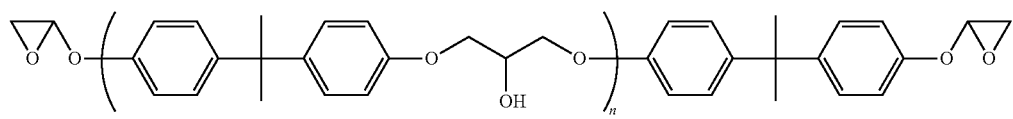
LX-01

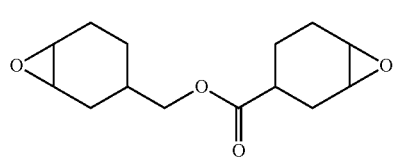
CEL 2021

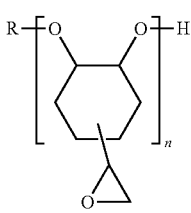
EHPE 3150

In the presentation of the following experimental data, abbreviations are used to simplify the naming of monomers and catalysts. The following listing of abbreviations provides an appropriate name for each abbreviation. Further, it will be noted that the experimental data provided does not limit the scope of the embodiments of the present invention. Rather such data is merely illustrative of the preparation of monomers useful for the preparing illustrative polymer and composition embodiments in accordance with the present invention as well as demonstrating the usefulness of such embodiments.

Further, as will be shown below, some embodiments in accordance with the present invention incorporate a thermal initiator and a crosslinking additive to a polymer composition to provide thermally induced crosslinking after image development. The compositions shown in Examples C8, C9 and C10 where Powderlink 1174, Hexamethoxymethylmelamine and Cymel 301 are provided, respectively, as crosslinking additives and TAG-382 as the thermal initiator for each composition demonstrate that the incorporation of such additives can have a significant impact on dissolution rate (DR). As indicated in Table 1, Example C8 has the highest DR of any composition, and while Examples C9 and C10 have lower DRs, they are close to the DR of the composition described in Example C3.

Some polymer composition embodiments in accordance with the present invention, include a photo acid generator (PAG) and can optionally include a photosensitizer. Exemplary PAGs include, but are not limited to, (p-isopropylphenyl)(p-methylphenyl)-iodonium tetrakis (pentafluorophenyl) borate (Rhodorsil PI 2074, Rhodia, Inc.) and TAG 382 (Toyo Ink):

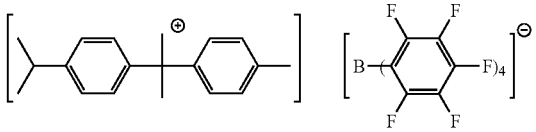

Rhodorsil 2074, Photo acid generator
CAS 178233-72-2

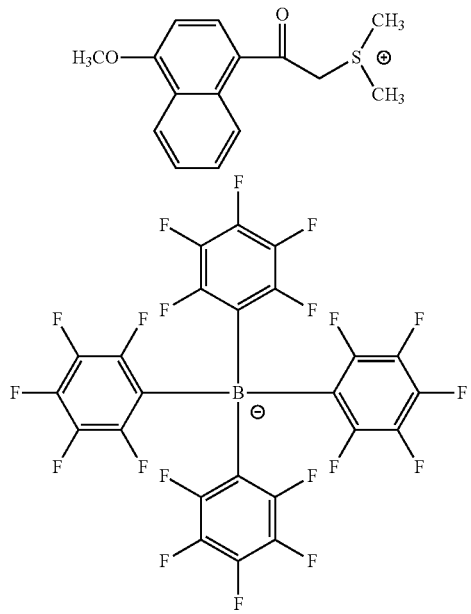

TAG 382
$C_{39}H_{17}BF_{20}O_2S$
Mol. Wt.: 940.40

PAGs generally absorb actinic radiation over a broad range of wavelengths while in modern photoexposure tools, a limited range of wavelengths or even a single wavelength, is provided. Therefore, in addition to a PAG, a photosensitizer can be included within the polymer composition where such material is selected to be absorbing at a wavelength(s) used for the image-wise exposure. While any appropriate photosensitizer can be employed, a useful photosensitizer for exposure at wavelengths that include 248 nanometers includes CPTX, the structure, name and CAS number of which is shown below:

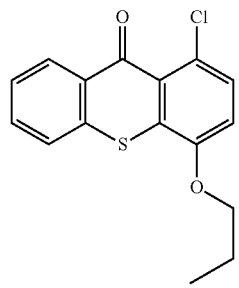

CPTX, photosensitizer
1-chloro-4-propoxy-9-H-thioxanthen-9-one
CAS 142770-42-1

Monomers

| | |
|---|---|
| HFANB | 2-(bicyclo[2.2.1]hept-5-en-2-ylmethyl)-1,1,1,3,3,3-hexafluoropropan-2-ol |
| TFSNB | N-(bicyclo [2.2.1]hept-5-en-2-ylmethyl)-1,1,1-trifluoromethanesulfonamide |
| FPCNB | 2,2,3,3,3-pentafluoropropylester of 5-norbornene-2-carboxylic acid |
| NBMeOAc | 2-hydroxymethyl-5-norbornene acetate |
| NBPhOAc | 4-(bicyclo[2.2.1]hept-5-en-2-yl)phenyl acetate |
| t-BuEsNB | t-butylester of 5-norbornene-2-carboxylic acid |
| MCPNB | 5-(1-methylcyclopentyl)bicyclo[2.2.1]hept-2-ene |
| NB | norbornene |
| TFENB | bicyclo[2.2.1]hept-5-ene-2-carboxylic acid tetrahydro-2-oxo-3-furanyl ester |
| TESNB | (bicyclo[2.2.1]hept-5-en-2-ylmethyl)triethoxysilane |
| MGENB | 2-((bicyclo[2.2.1]hept-5-en-2-ylmethoxy)methyl)oxirane |
| Acid NB | bicyclo[2.2.1]hept-5-ene-2-carboxylic acid |
| DecNB | 5-decylbicyclo[2.2.1]hept-2-ene |
| PENB | 5-phenethylbicyclo[2.2.1]hept-2-ene |
| BuNB | 5-butylbicyclo[2.2.1]hept-2-ene |
| NBM(PhMeOH)$_2$ | 4,4'-(bicyclo[2.2.1]hept-5-en-2-ylmethylene)bis(2-methylphenol) |
| NBMMPA | 4-norbornenylmethyl-2-methoxyphenol acetate |
| NBMMPhOH | 4-(bicyclo[2.2.1]hept-4-en-2-ylmethyl)-2-methoxyphenol |
| NBMMHFP | 2-((bicyclo[2.2.1]hept-5-en-2-yloxy)methyl)-1,1,1,3,3,3-hexafluoropropan-2-ol |
| EPENB | ethyl 3-(bicyclo[2.2.1]hept-2-en-2-yl)propanoate |
| EPANB | 3-(bicyclo[2.2.1]hept-2-en-2-yl)propanoic acid |
| NBPhOH | 4-(bicyclo[2.2.1]hept-5-en-2-yl)phenol |
| NBE4ECBz | 2-(bicyclo[2.2.1]hept-5-en-2-yl)ethyl 4-((ethoxycarbonyl)oxy)benzoate |
| NBE2AcOBz | 2-(bicyclo[2.2.1]hept-5-en-2-yl)ethyl 2-acetoxybenzoate |
| NBE2OHBz | 2-(bicyclo[2.2.1]hept-5-en-2-yl)ethyl 2-hydroxybenzoate |
| NBMGlyHFP | 2-(2-(bicyclo[2.2.1]hept-5-en-2-yloxy)ethoxy)-1,1,1,3,3,3-hexafluoropropan-2-ol |

Catalysts and Cocatalysts

| | |
|---|---|
| DANFABA | dimethylanilinium tetrakis (pentafluorophenyl) borate |
| DANTTSM | dimethylanilinium tris(trifluoromethylsulfonyl)methanide |
| NiArf | $(\eta^6\text{-toluene})\text{Ni}(C_6F_5)_2$ |
| Pd$_2$dba$_3$•xdba | Tris(dibenzylideneacetone)dipalladium(0), 20.92% palladium, available from Umicore |

Synthesis of DANTTSM, 100.0 g of a 59% solution of $HC(SO_2CF_3)_3$ in water (0.143 mol) and 40 ml diethyl ether was charged into a reaction vessel at room temperature. To this 17.34 g (0.143 mol) of dimethylaniline in 100 ml diethyl ether was added dropwise. After the addition was completed, the mixture was stirred for five minutes, and then washed with water twice. The ether was then removed by rotoevaporation, and then the resulting viscous material was dried under vacuum overnight. The residual material was then recrystallized from a 1:1 mixture of 1-butanol and hexane, yielding 55.0 g (72%) of a white crystalline material.

A. Monomer Synthesis

Example A1

NBPhOAc

In a 2-gallon stainless steel reactor equipped with a thermocouple, electric heating jacket, and mechanical agitator, 1750 g dicyclopentadiene, 2147 g p-acetoxystyrene, and 64 g phenothiazine were charged. Stirring was started, the reactor was evacuated of air and pressurized to 5 psig with nitrogen. Heating to 160° C. commenced and the reactor held at that temperature for 6 hours. The reactor was then cooled to ambient temperature and the reaction mixture was emptied. The reaction mixture was distilled (110-120 mtorr, pot temperature 113-114° C.) to give 1227 g of 99% pure (GC) NBPhOAc.

Example A2

NBMMPA

A 19-liter Parr Reactor was charged with 900 g (6.8 mol) dicyclopentadiene and 11.2 kg (~98% pure, 54.5 mol) eugenyl acetate and then, while stirring, flushed three times with nitrogen. The reaction was brought to 200° C. over a period of 3 hr, while the pressure maximized at 23 psi from 0 psi. The reaction was stirred for 6 hours at 200° C. and pressure range was 12-23 psi, and then allowed to cool to room temperature overnight. GC analysis indicated the product mixture to contain, 72.6% eugenol acetate, 0.1% DCPD, 25.8% NBMMPA, and 0.2% 4-NBCH2C6H3-2-MeO—OH. Total weight recovered from the reactor was about 12 Kg.

This material was distilled under high vacuum through 6-inch Vigreaux column and distillation head to remove the bulk of excess eugenol acetate. After removal of 580.3 g of eugenyl acetate, the 6-inch Vigreaux column was removed and the distillation head was connected directly. A total 8855.5 g of eugenol acetate was recovered.

About 2.1 Kg of the pot residue was further distilled under high vacuum and about 0.85 kg of NBMMPA, with an assay of greater than 90 area % by GC, was obtained. This material was then acetylated with 0.6 kg acetic anhydride and 0.4 kg tetrahydrofuran in an agitated glass flask where the flask was heated to 81° C. and held for 7 hours at this temperature. This reaction mixture was distilled and 0.15 kg of NBMMPA was recovered with purity greater than 97 area % by GC.

Example A3

NBE4ECBz

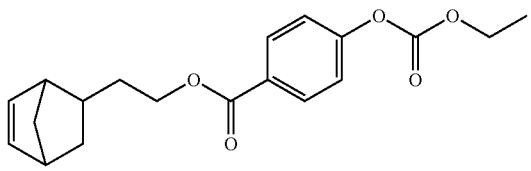 [SMILES: CCOC(=O)Oc1ccc(C(=O)OCCC2CC3C=CC2C3)cc1]

A 100 ml round bottomed flask was charged with 1.4 g (10.1 mmol) of 4-hydroxybenzoic acid and 45 ml of a 0.68 M aqueous solution of sodium hydroxide (30 mmol). The flask was then connected to a bubbler to monitor any gas generation that might occur. The mixture was then stirred until all of the 4-hydroxybenzoic acid was fully dissolved and then cooled to 0° C. using ice/water bath. Once at temperature, 2.2 g (1.9 ml, 20 mmol) of ethyl chloroformate was added drop-wise to the reaction mixture and then maintained at 0° C. for one half hour with stirring before being allowed to warm slowly to room temperature. Stirring was continued for an additional 16 hours. The reaction mixture was then acidified (to pH 2) with a 1M aqueous solution of sodium hydrogen sulfate and the resulting slurry extracted with ethyl acetate (3×35 ml). The combined extracts were dried with anhydrous $Na_2SO_4$, filtered and the solvents were removed under reduced pressure. The resulting residue was triturated with toluene, and a white solid collected by filtration to yield 630 mg (30%) of the phenol 4-(chlorocarbonyl)phenyl ethyl carbonate.

A 25 mL flask was charged with 0.63 g (3.0 mmol) 4-ethoxycarboxybenzoic acid, and toluene (7 ml). The resulting slurry was placed under a blanket of nitrogen. The reaction mixture was heated to 50° C. in an oil bath by which temperature the substrate acid had dissolved. Oxalyl chloride (685 mg, 5.4 mmol, 1.8 eq) was added drop-wise via syringe. The reaction was further heated to 85° C. and maintained at that temperature for 16 hours. Reaction progress was monitored by TLC analysis on $SiO_2$ plates using 5% v/v EtOAc in toluene as the eluent. 254 nm UV light (UVP Model UVGL-251 amp) indicated a single product spot and consumption of the starting materials. The solvents were removed under reduced pressure and the crude 4-(chlorocarbonyl)phenyl ethyl carbonate was used without further purification.

A 25 ml round bottomed flask was charged with 0.69 g (3.0 mmol) 4-ethoxycarboxybenzoyl chloride, toluene (7 ml), and bicyclo[2.2.1]hept-5-ene-2-ethanol (456 mg, 3.3 mmol, 1.1 eq). The flask was placed under a blanket of nitrogen, and the reaction was performed without temperature controls or monitoring. Triethylamine (379 mg, 3.75 mmol, 1.25 eq) was added drop-wise via syringe. The reaction was stirred for 1 hour. Reaction progress was monitored by TLC analysis on $SiO_2$ plates using 5% v/v EtOAc in toluene as the eluent. 254 nm UV light (UVP Model UVGL-25 lamp) indicated a single product spot and consumption of the starting materials. The solvents were removed under reduced pressure and the crude product was subjected to column chromatography (2% EtOAc v/v in Toluene, $SiO_2$ 230-400 mesh Fluka) to yield 980 mg (99% yield) of 2-(bicyclo[2.2.1]hept-5-en-2-yl)ethyl 4-(ethoxycarbonyloxy)benzoate as a pure material.

$^1$H NMR (CDCl$_3$, Me$_4$Si) δ 0.59 (d, J=5.0 Hz 1H), 1.41 (m, 5H), 1.53 (m, 1H), 1.60 (m, 1H), 1.92 (m, 1H), 2.15 (m, 1H), 2.79 (s, 1H), 2.84 (s, 1H), 4.32 (m, 5H), 5.9-6.2 (m, 2H) 7.25 (m, 2H), 8.08 (m, 2H).

Example A4

NBE2AcOBz

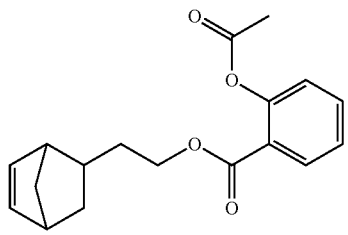 [SMILES: CC(=O)Oc1ccccc1C(=O)OCCC1CC2C=CC1C2]

A 1 L 3 necked round bottomed flask equipped with a nitrogen inlet, a rubber septum and a 100 ml dropping addition funnel was charged with 24.1 g (3.0 mmol) acetylsalicylic acid and toluene (300 ml, 259 g). The resulting slurry was placed under a blanket of nitrogen. The reaction was heated to 50° C. by which temperature the substrate acid had dissolved. Oxalyl chloride (30.6 g, 241 mmol, 1.80 eq) diluted with toluene (60 ml, 52 g) was added drop-wise via addition funnel. The reaction was further heated to 85° C. and maintained at that temperature for 16 hours. Reaction progress was monitored by TLC analysis on $SiO_2$ plates using 5% v/v EtOAc in toluene as the eluent. 254 nm UV light (UVP Model UVGL-251 amp) indicated a single product spot and consumption of the starting materials. The solvents were removed under reduced pressure and the crude 2-acetylsalicyloyl chloride is used without further purification.

A 2 L flask equipped with nitrogen inlet and rubber septum was charged with 26.6 g (134 mmol) acetylsalicyloyl chloride, toluene (275 ml), and bicyclo[2.2.1]hept-5-ene-2-ethanol (20.4 g, 147 mmol, 1.1 eq). The reaction mixture was blanketed under nitrogen. Triethylamine (16.9 g, 23.3 ml, 167 mmol, 1.25 eq) was added drop-wise via syringe. The reaction was stirred for hour. Reaction progress was monitored by TLC analysis on $SiO_2$ plates using 5% v/v EtOAc in toluene as the eluent. 254 nm UV light (UVP Model UVGL-251 amp) indicated two major product spots of the exo and endo isomers. The TLC analysis also showed the consumption of the starting chloride. Solvents were removed under reduced pressure and the residue was subjected to column chromatography (1-3% EtOAc v/v in Toluene, $SiO_2$ Fluka 230-400 mesh) to yield 26.9 g (66.8% yield) of NBE2AcOB.

$^1$H NMR ($CDCl_3$, $Me_4Si$) δ 0.59 (d, J=5.0 Hz 1H), 1.25 (s, 1H), 1.35 (s, 1H), 1.42 (s, 1H), 1.50 (s, 1H), 1.90 (m, 1H), 2.15 (m, 1H), 2.35 (s, 3H), 2.79 (s, 1H), 2.82 (s, 1H), 4.26 (m, 2H), 5.9-6.2 (m, 2H), 7.10 (d, J=8.0 Hz 1H), 7.32 (t, J=8.0 Hz 1H) 7.55 (dd, J=8.0 Hz 1H), 8.02 (dd, J=8.0 Hz 1H).

Example A5

NBE2OHBz

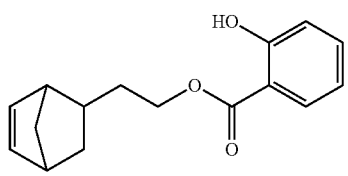 [SMILES: O=C(OCCC1CC2C=CC1C2)c1ccccc1O]

A 250 ml flask equipped with gas adapter was charged with 3.0 g (1.0 mmol) NBE2AcOBz, methanol (56.9 ml, 45 g), and water (22.5 g). A saturated sodium hydrogen carbonate solution (22.5 ml) was added. The reaction flask was connected to a bubbler to monitor possible out-gassing. The reaction was stirred for 24 hours. TLC analysis using 5% EtOAc v/v in Toluene as eluent on $SiO_2$ with 254 nm UV light visualization indicated a new compound with a higher RF value than the starting materials. The reaction was diluted with water (25 g) and extracted with two 50 mL aliquots of an Ethyl Acetate/Toluene solvent mixture (1:1 v/v) and once with Ethyl Acetate/Heptane solvent mixture (25 ml+2 ml) the organic fractions were combined and solvents were removed under reduced pressure. The product residue was subjected to column chromatography (1:1 Heptane:Toluene, v/v $SiO_2$, 230-400 mesh, Fluka). The fractions containing the fastest eluting material were collected and the organic solvent was removed under reduced pressure. Collected 1.97 g, (76.3% yield) of NBE2OHBz.

$^1$H NMR ($CDCl_3$, $Me_4Si$) δ 0.62 (d, J=5.0 Hz 1H), 1.26 (d, J=8.0 Hz 1H), 1.37 (s, 1H), 1.42 (d, J=2.0 Hz 1H), 1.61 (m, 1H), 1.92 (m, 1H), 2.15 (m, 1H), 2.80 (s, 1H), 2.84 (s, 1H), 4.35 (m, 2H), 5.9-6.2 (m, 2H), 6.88 (t, J=8.0 Hz 1H), 6.98 (d, J=8.5 Hz 1H) 7.44 (d, J=7.0 Hz 1H), 7.86 (s, 1H), 10.85 (s 1H).

B. Polymer Synthesis

Example B1

Homopolymerization and Methanolysis of NBPhOAc

NBPhOAc (20 g, 0.088 mol) was dissolved in 94.4 g of ethyl acetate (EtOAc) and charged to a reaction vessel. The solution was then sparged with nitrogen for 30 min to remove oxygen and then heated to 80° C. Once at temperature, NiArf (1.70 g, 0.0040035 mol) in 17.2 g of EtOAc (prepared in a glove box) was added via syringe to the reaction vessel. The mixture was allowed to stir at 80° C. for 1.5 h, after which the solution was cooled to room temperature and water added to destroy any residual catalyst.

The mixture was then treated with a peracetic acid solution to remove Ni residues, filtered and solvents were removed from the filtrate by rotovaporation to give a solid. The solid was redissolved in 1:1 (by weight) THF:MeOH to give a 16.7 wt % solution which was added to a stainless steel reactor along with 23 g of a 25% methanolic solution of NaOMe. The reactor was pressurized with nitrogen to 20 psig and vented three times and then pressurized to 20 psig a fourth time before being heated to 100° C. and held at that temperature for 3 h. The mixture was cooled to room temperature and the methanolysis reaction confirmed to be complete by IR spectroscopy (absence of carbonyl peaks at ~1730 $cm^{-1}$).

After purification and reprecipitated from THF by the addition of heptane, 14 g (70%) of poly(NBPhOH), as an orange powder, was isolated (GPC Mw=8310, Mn=3680).

Example B2

Homopolymerization and Methanolysis of NBPhOAc

NBPhOAc (30 g, 0.13 mol) was dissolved in 94.4 g of EtOAc and charged to a reaction vessel. The solution was sparged with nitrogen for 30 min to remove oxygen and then heated to 80° C. Once at temperature, ($η^6$-toluene)Ni($C_6F_5$)$_2$ (2.66 g, 0.005 mol) in 25.8 g of EtOAc (prepared in a glove box) was added via syringe to the reaction vessel. The mixture was allowed to stir at 80° C. for 1.5 h, after which the solution was cooled to room temperature and water (approximately 0.2 mL) was added to destroy any residual catalyst.

The mixture was treated with a peracetic acid solution to remove Ni residues, filtered and solvents were removed from the filtrate by rotovaporation to give a solid. The solid was redissolved in 1:1 (by weight) THF:MeOH to give a 23 wt % solution which was added to a stainless steel reactor along with 38 g of a 25% methanolic solution of NaOMe. The reactor was pressurized with nitrogen to 20 psig and vented, three times and then pressurized to 20 psig and heated to approximately 100° C. for 3 h. The mixture was cooled to room temperature and the methanolysis reaction confirmed to be complete by IR spectroscopy (absence of carbonyl peaks at ~1730 cm$^{-1}$).

After purification using ion exchange resins, filtration, solvent removal and reprecipitated from THF by the addition of heptane, approximately, 24 g (80%) of the poly(NBPhOH), as an orange powder, was isolated (GPC Mw=6300, Mn=3350).

Example B3

Polymerization and Methanolysis of NBPhOAc/HFANB

NBPhOAc (2.74 g, 12.0 mmol) and HFANB (0.8 g, 3 mmol) was dissolved in 15.2 g of EtOAc and charged to a reaction vessel. The solution was sparged with nitrogen for 30 min to remove oxygen and then heated to 80° C. Once at temperature, NiArf (0.29 g, 0.60 mmol) in 5.00 g of EtOAc (prepared in a glove box) was added via syringe to the reaction vessel. The mixture was allowed to stir at 80° C. for 3.0 h, after which the solution was cooled to room temperature. The solvents were removed from the resulting solution by rotovaporation to give a solid. The solid was redissolved in THF to give a 10.5 wt % solution. 23.8 g of 10% KOHaq was then added to the solution and heated to approximately 60° C. for 7 h. The mixture was then allowed to cool to room temperature and the reaction was confirmed to be complete by IR spectroscopy (absence of carbonyl peaks at ~1730 cm$^{-1}$). The reaction mixture was then treated with a peracetic acid solution to remove Ni residues and filtered.

The solvents were removed from the filtrate by rotovaporation to give a light yellow solid. The yellow solid was redissolved in THF (50 wt %) and was added to hexane (50× by weight) to give a light yellow powder that was filtered and dried at 80° C. for 5 h. Approximately, 2.3 g (84%) of the NBPhOH/HFANB polymer was isolated (GPC Mw=8270 Mn=5067). The molar ratio of NBPhOH and HFANB was determined to be 80 to 20 by $^1$H NMR.

Example B4

Homopolymerization and Hydrolysis of NBPhOAc

NBPhOAc (57.0 g, 250 mmol) was dissolved in 62.0 g of toluene and charged to a reaction vessel. The solution was then sparged with nitrogen for 30 minutes to remove oxygen. DANFABA (0.60 g, 0.75 mmol) was added to the reaction vessel in a glove box and sealed. Formic acid (0.060 g, 1.3 mmol) was added to the solution via syringe. The mixture was heated to 90° C. Pd$_2$(dba)$_3$ xdba (0.23 g, 0.21 mmol) in 22.7 g of toluene (prepared in a glove box) was added via syringe to the reaction vessel. The mixture was stirred for 24 hours.

The reaction vessel was cooled to ambient temperature and opened. Sodium hydroxide (30 g, 0.75 mol), tetrahydrofuran (50.0 g) and water (50.0 g) was added to the reaction vessel. The reactor was sealed and sparged with nitrogen. The mixture was heated to 90° C. and stirred for 24 hours. The reaction mixture was cooled to ambient temperature and concentrated hydrochloric acid (100 g) was added. The resulting solution was washed three times with 200 mL of water. The organic phase was separated from the aqueous phase. After concentration, the polymer was isolated by precipitation using hexanes to give 32 g (69% yield) of powder (GPC Mw=5410, Mn=2930). The dissolution rate in 0.26N TMAH of a film of the polymer spun on 4 inch thermal oxide silicon wafer was 109 nm/s.

Example B4a

Polymerization and Hydrolysis of NBPhOAc with DANTTSM

NBPhOAc (50.0 g, 219 mmol) was mixed with 30.3 g of anhydrous EtOAc and charged to a reaction vessel. To this solution was added formic acid (0.20 g, 4.3 mmol) as well as 0.350 g of a DANTTSM (657 µmol). The solution was sparged with nitrogen for 30 min to remove oxygen and then heated to 80° C. Once at temperature, Pd$_2$(dba)$_3$ xdba (0.201 g, 219 µmol) in 9.83 g of anhydrous EtOAc (prepared in a glove box) was added via syringe to the reaction vessel. The mixture was allowed to stir at 80° C. for 16 h, after which the solution was cooled to room temperature. The solvents were removed from the resulting solution by rotovaporation to give a solid. The solid was redissolved in THF to give a 10 wt % solution. Residual catalyst components were removed from the reaction mixture. Sodium hydroxide (263 g of 10% solution in water) was then added to the reaction mixture and heated to approximately 60° C. for 4 h. The mixture was then allowed to cool to room temperature and the reaction was confirmed to be complete by IR spectroscopy (absence of carbonyl peaks at ~1730 cm$^{-1}$). The reaction mixture was then treated with acetic acid solution and then washed with water/EtOAc until the pH exceeded four. The solvents were removed by rotovaporation to give a light yellow solid. The yellow solid was redissolved in THF (25 wt %) and was added to hexane (50 fold excess) to give a light yellow powder that was filtered and dried at 50° C. for 16 h. Approximately 31.5 g (77%) of polymer was isolated (GPC Mw=4400 Mn=2700). The dissolution rate in 0.26N TMAH of a film of the polymer spun on 4 inch thermal oxide silicon wafer was 300 nm/s.

Example B4b

Homopolymerization and Hydrolysis of NBPhOAc

NBPhOAc (34.2 g, 150 mmol) was dissolved in 37.2 g of toluene and charged to a reaction vessel. The solution was then sparged with nitrogen for 30 minutes to remove oxygen. DANFABA (0.36 g, 0.45 mmol) was added to the reaction vessel in a glove box and sealed. Formic acid (0.030 g, 0.75 mmol) was added to the solution via syringe. The mixture was heated to 90° C. Pd$_2$(dba)$_3$ xdba (0.14 g, 0.15 mmol) in 13.6 g of toluene (prepared in a glove box) was added via syringe to the reaction vessel. The mixture was stirred for 17 hours. Residual catalyst components were removed from the reaction mixture. Sodium hydroxide (19 g, 0.48 mol) dissolved in minimum amount of water was added to the reaction vessel. The reactor was sealed and sparged with nitrogen, heated to 80° C. and stirred for 17 hours. The reaction mixture was cooled to ambient temperature, transferred to a 1 L beaker with the aid of tetrahydrofuran and concentrated hydrochloric acid (100 g) was added. The resulting solution was washed three times with water. The organic phase was separated from the aqueous phase. The polymer was isolated by precipitation using hexanes to give 25 g (89% yield) of powder (GPC Mw=7140, Mn=3540). The dissolution rate in 0.26N TMAH of a film of the polymer spun on 4 inch thermal oxide silicon wafer was 143 nm/sec.

Example B5

Polymerization and Methanolysis of NBPhOAc/NBMGlyHFP

NBPhOAc (21 g, 92 mmol) and NBMGIyHFP (2.4 g, 8.0 mmol) were dissolved in 25.7 g of toluene and charged to a reaction vessel. The solution was then sparged with nitrogen for 30 min to remove oxygen. DANFABA (0.24 g, 0.30 mmol) was added to the reaction vessel in a glove box and sealed. Formic acid (0.023 g, 0.50 mmol) was added to the solution via syringe and heated to 75° C. $Pd_2(dba)_3$ xdba (0.092 g, 0.085 mmol) in 9.1 g toluene (prepared in a glove box) was added via syringe to the reaction vessel. The reaction mixture was stirred for 17 hours.

Residual catalyst components were removed from the reaction mixture and then sodium methoxide (45 g of a 25% methanolic solution) was added and the mixture heated to 80° C. for 24 hours under a nitrogen atmosphere. The reaction mixture was then cooled to ambient temperature, filtered and treated with concentrated hydrochloric acid (75 g) and water (150 mL). The aqueous layer was separated and the organic layer was treated a second time with concentrated hydrochloric acid (30 g) and water (100 mL). The aqueous layer was removed and the organic layer was washed three times with 150 mL of water, separated from the water phase and concentrated. The polymer was isolated from the organic phase by precipitation using hexanes to give 12 g (61% yield) of powder (GPC Mw=7090, Mn=3480). The molar ratio of NBPhOH to NBMGIyHFP was determined to be 93 to 7 by $^1$H NMR. The dissolution rate in 0.26N TMAH of a film of the polymer spun on 4 inch thermal oxide silicon wafer was 112 nm/s.

Example B6

Polymerization and Methanolysis of NBPhOAc/NBMGlyHFP

NBPhOAc (21 g, 90 mmol) and NBMGlyHFP (3.0 g, 10 mmol) were dissolved in 35.0 g of toluene and charged to a reaction vessel. The solution was then sparged with nitrogen for 30 min to remove oxygen. DANFABA (0.24 g, 0.30 mmol) and $Pd_2(dba)_3$ xdba (0.092 g, 0.085 mmol) was added to the reaction vessel in a glove box and sealed. Formic acid (0.01 g, 0.22 mmol) was added to the solution via syringe and heated to 70° C. for 24 hours.

A solution of 25% methanolic NaOMe (50 g) was added and the mixture was heated to 80° C. for 15 hours under a nitrogen atmosphere. The reaction mixture was cooled to ambient temperature and treated with concentrated hydrochloric acid (50 g) and water (100 mL). The organic phase was separated from the water phase, washed three times with 150 mL of water, and concentrated. The polymer was isolated by precipitation using hexanes to give 12 g (61% yield) of powder (GPC Mw=7960, Mn=4100). The molar ratio of NBPhOH to NBMGIyHFP was determined to be 91 to 9 by $^1$H NMR. The dissolution rate in 0.26N TMAH of a film of the polymer spun on 4 inch thermal oxide silicon wafer was 252 nm/s.

Example B7

Polymerization and Hydrolysis of NBMMPA/NBMGlyHFP

NBMMPA (6.2 g, 24 mmol) and NBMGIyHFP (4.9 g, 16 mmol) were dissolved in 12.8 g of toluene and charged to a reaction vessel. The solution was then sparged with nitrogen for 30 min to remove oxygen. DANFABA (0.096 g, 0.12 mmol) was added to the reaction vessel in a glove box and sealed. Formic acid (0.01 g, 0.22 mmol) was added to the solution via syringe and heated to 80° C. $Pd_2(dba)_3$ xdba (0.037 g, 0.034 mmol) in 3.6 g toluene (prepared in a glove box) was added via syringe to the reaction vessel and stirred for 17 hours.

Sodium hydroxide (4.8 g, 120 mmol) and water (15 mL) added and the mixture was heated to 80° C. for 17 hours under a nitrogen atmosphere. The reaction mixture was cooled to ambient temperature and treated with concentrated hydrochloric acid (30 g) and water (25 mL). The organic phase was separated and treated a second time with concentrated hydrochloric acid (15 g) and washed three times with 100 mL of water. The organic phase was then separated and concentrated. The polymer was isolated by precipitation using hexanes to give 2.8 g (28% yield) of powder (GPC Mw=12390, Mn=5440). The molar ratio of NBMMPhOH to NBMGIyHFP was determined to be 64 to 36 by $^1$H NMR. The dissolution rate in 0.26N TMAH of a film of the polymer spun on 4 inch thermal oxide silicon wafer was 4.4 nm/s.

Example B8

Polymerization and Hydrolysis of NBPhOAc/NBMGlyHFP

NBPhOAc (8.55 g, 37.5 mmol) and NBMGIyHFP (1.5 g, 4.2 mmol), a feed ratio of 88:12, were dissolved in 33.2 g of anhydrous EtOAc and charged to a reaction vessel. The solution was sparged with nitrogen for 30 min to remove oxygen and then heated to 80° C. Once at temperature, NiArf (0.672 g, 1.39 mmol) in 6.78 g of EtOAc (prepared in a glove box) was added via syringe to the reaction vessel. The mixture was allowed to stir at 80° C. for 2.0 h, after which the solution was cooled to room temperature. The solvents were removed from the resulting solution by rotovaporation to give a solid. The solid was redissolved in THF to give a 10 wt % solution. Sodium hydroxide (44.9 g of a 10% aqueous solution) was then added to the solution and heated to approximately 60° C. for 4 h. The mixture was then allowed to cool to room temperature and the reaction was confirmed to be complete by IR spectroscopy (absence of carbonyl peaks at ~1730 cm$^{-1}$). The reaction mixture was then treated with a peracetic acid solution to remove Ni residues and then washed with water/EtOAc until the pH exceeded four. The solvents were removed by rotovaporation to give a light yellow solid. The yellow solid was redissolved in THF (25 wt %) and was added to hexane (50 fold excess) to give a light yellow powder that was filtered and dried at 50° C. for 16 h. Approximately 7.58 g (90%) of polymer was isolated (GPC Mw=23500 Mn=12170). The dissolution rate in 0.26N TMAH of a film of the polymer spun on 4 inch thermal oxide silicon wafer was 300 nm/s.

Example B9

Polymerization and Hydrolysis of NBPhOAc/HFANB with DANTTSM

NBPhOAc (30.76 g, 134.8 mmol) and HFANB (9.24 g, 33.7 mmol) were mixed with 2.53 g of anhydrous EtOAc and charged to a reaction vessel. To this solution was added formic acid (0.16 g, 3.4 mmol) and 27.0 g of a 1% DANTTSM solution in anhydrous EtOAc (510 μmol). The solution was sparged with nitrogen for 30 min to remove oxygen and then heated to 80° C. Once at temperature, $Pd_2(dba)_3$ xdba (0.154 g, 144 μmol) in 2.93 g of anhydrous EtOAc (prepared in a glove box) was added via syringe to the reaction vessel. The mixture was allowed to stir at 80° C. for 16 h, after which the solution was cooled to room temperature. The solvents were removed from the resulting solution by rotovaporation to give a solid. The solid was redissolved in THF to give a 10 wt % solution. Sodium hydroxide (202 g of 10% solution in water) was then added to the solution and heated to approximately 60° C. for 4 h. The mixture was then allowed to cool to room temperature and the reaction was confirmed to be complete by IR spectroscopy (absence of carbonyl peaks at ~1730 $cm^{-1}$). The reaction mixture was then treated with acetic acid solution and then washed with water/EtOAc until the pH exceeded four. The solvents were removed by rotovaporation to give a light yellow solid. The yellow solid was redissolved in THF (25 wt %) and was added to hexane (50 fold excess) to give a light yellow powder that was filtered and dried at 50° C. for 16 hr. Approximately 28.5 g (84%) of polymer was isolated (GPC Mw=4820 Mn=2720). The molar ratio of NBPhOH to HFANB was determined to be 86 to 14 by $^1$H NMR. The dissolution rate in 0.26N TMAH of a film of the polymer spun on 4 inch thermal oxide silicon wafer was 300 nm/s.

Example B10

Polymerization and Hydrolysis of NBPhOAc/NBMMHFP with DANTTSM

NBPhOAc (3.00 g, 13.1 mmol) and NBMMHFP (1.0 g, 3.3 mmol) were mixed with 1.64 g of anhydrous EtOAc and charged to a reaction vessel. To this solution was added formic acid (0.015 g, 0.33 mmol) and 1.32 g of a 2% DANTTSM solution in anhydrous EtOAc (49.3 μmol). The solution was sparged with nitrogen for 30 min to remove oxygen and then heated to 80° C. Once at temperature, $Pd_2(dba)_3$ xdba (0.015 g, 14 μmol) in 0.286 g of anhydrous EtOAc (prepared in a glove box) was added via syringe to the reaction vessel. The mixture was allowed to stir at 80° C. for 16 h, after which the solution was cooled to room temperature. The solvents were removed from the resulting solution by rotovaporation to give a solid. The solid was redissolved in THF to give a 10 wt % solution. Sodium hydroxide (15.7 g of 10% water solution) was then added to the solution and heated to approximately 60° C. for 4 h. The mixture was then allowed to cool to room temperature and the reaction was confirmed to be complete by IR spectroscopy (absence of carbonyl peaks at ~1730 $cm^{-1}$). The reaction mixture was then treated with acetic acid solution and then washed with water/EtOAc until the pH exceeded four. The solvents were removed by rotovaporation to give a light yellow solid. The yellow solid was redissolved in THF (25 wt %) and was added to hexane (50 fold excess) to give a light yellow powder that was filtered and dried at 50° C. for 16 h. Approximately 2.82 g (83%) of polymer was isolated (GPC Mw=4210 Mn=2480). The molar ratio of NBPhOH to NBMMHFP was determined to be 86 to 14 by $^1$H NMR. The dissolution rate in 0.26N TMAH of a film of the polymer spun on 4 inch thermal oxide silicon wafer was 226 nm/s.

Example B11

Polymerization and Hydrolysis of NBPhOAc/NBMGlyHFP

NBPhOAc (7.57 g, 33.2 mmol) and NBMGlyHFP (2.43 g, 7.3 mmol) were dissolved in 32.1 g of anhydrous EtOAc and charged to a reaction vessel. The solution was sparged with nitrogen for 30 min to remove oxygen and then heated to 80° C. Once at temperature, NiArf (0.784 g, 1.62 mmol) in 7.85 g of EtOAc (prepared in a glove box) was added via syringe to the reaction vessel. The mixture was allowed to stir at 80° C. for 2.0 h, after which the solution was cooled to room temperature. The solvents were removed from the resulting solution by rotovaporation to give a solid. The solid was redissolved in THF to give a 10 wt % solution. Sodium hydroxide (39.8 g of 10% water solution) was then added to the solution and heated to approximately 60° C. for 4 h. The mixture was then allowed to cool to room temperature and the reaction was confirmed to be complete by IR spectroscopy (absence of carbonyl peaks at ~1730 $cm^{-1}$). The reaction mixture was then treated with a peracetic acid solution to remove Ni residues and then washed with water/EtOAc until the pH exceeded four. The solvents were removed by rotovaporation to give a light yellow solid. The yellow solid was redissolved in THF (25 wt %) and was added to hexane (50 fold excess) to give a light yellow powder that was filtered and dried at 50° C. for 16 hr. Approximately 6.95 g (81% yield) of polymer was isolated (GPC Mw=10740 Mn=6320). The molar ratio of NBPhOH to NBMGlyHFP was determined to be 82 to 18 by $^1$H NMR. The dissolution rate in 0.26N TMAH of a film of the polymer spun on 4 inch thermal oxide silicon wafer was 272 nm/s.

Example B12

Polymerization of NBPhOH/NBM(PhMeOH)$_2$

NBPhOH (1.68 g, 9.0 mmol) and NBM(PhMeOH)$_2$ (0.32 g, 1.0 mmol) were dissolved in 4.88 g of anhydrous EtOAc and charged to a reaction vessel. The solution was sparged with nitrogen for 30 min to remove oxygen and then heated to 80° C. Once at temperature, NiArf (0.32 g, 0.67 mmol) in 3.24 g of EtOAc (prepared in a glove box) was added via syringe to the reaction vessel. The mixture was allowed to stir at 80° C. for 2.0 h, after which the solution was cooled to room temperature. The solvents were removed from the resulting solution by rotovaporation to give a solid. The solid was redissolved in THF to give a 10 wt % solution. The reaction mixture was then treated with a peracetic acid solution to remove Ni residues and then washed with water/EtOAc until the pH exceeded four. The solvents were removed by rotovaporation to give a light yellow solid. The yellow solid was redissolved in THF (25 wt %) and was added to hexane (50 fold excess) to give a light yellow powder that was filtered and dried at 50° C. for 16 hr. Approximately 1.89 g (90% yield) of polymer was isolated (GPC Mw=13420 Mn=5830). The molar ratio of NBPhOH to NBM(PhMeOH)$_2$ was determined to be 89 to 11 by $^1$H NMR. The dissolution rate in 0.26N TMAH of a film of the polymer spun on 4 inch thermal oxide silicon wafer was 228 nm/s.

Example B13

Polymerization of NBM(PhMeOH)$_2$

NBM(PhMeOH)$_2$ (2.00 g, 6.25 mmol) was dissolved in 5.96 g of anhydrous EtOAc and charged to a reaction vessel. The solution was sparged with nitrogen for 30 min to remove oxygen and then heated to 80° C. Once at temperature, NiArf (0.20 g, 0.42 mmol) in 2.04 g of EtOAc (prepared in a glove box) was added via syringe to the reaction vessel. The mixture was allowed to stir at 80° C. for 2.0 h, after which the solution was cooled to room temperature. The solvents were removed from the resulting solution by rotovaporation to give a solid. The solid was redissolved in THF to give a 10 wt % solution. The reaction mixture was then treated with a peracetic acid solution to remove Ni residues and then washed with water/EtOAc until the pH exceeded four. The solvents were removed by rotovaporation to give a light yellow solid. The yellow solid was redissolved in THF (25 wt %) and was added to hexane (50 fold excess) to give a light yellow powder that was filtered and dried at 50° C. for 16 hr. Approximately 1.12 g (56% yield) of polymer was isolated (GPC Mw=5350 Mn=3850). The dissolution rate in 0.26N TMAH of a film of the polymer spun on 4 inch thermal oxide silicon wafer was 80 nm/s.

Example B14

Polymerization and Hydrolysis of NBPhOAc/EPENB

NBPhOAc (5.00 g, 21.9 mmol) and EPENB (1.06 g, 5.46 mmol) were dissolved in 24.2 g of anhydrous toluene and 5.2 g of MEK and charged to a reaction vessel. The solution was sparged with nitrogen for 30 min to remove oxygen and then heated to 60° C. Once at temperature, NiArf (0.265 g, 0.55 mmol) in 5 g of toluene (prepared in a glove box) was added via syringe to the reaction vessel. The mixture was allowed to stir at 60° C. for 3.5 h, after which the solution was cooled to room temperature. 40 g of THF and 50 g of 10% concentration KOH aqueous solution were added to the reaction mixture and heated to approximately 80° C. for 8 h. The mixture was then allowed to cool to room temperature and the reaction was confirmed to be complete by IR spectroscopy (absence of carbonyl peaks at ~1730 cm$^{-1}$). The reaction mixture was then treated with a acetic acid and formic acid to remove Ni residues and then washed with water/EtOAc until the pH exceeded four. The solvents were removed by rotovaporation to give a light yellow solid. The yellow solid was redissolved in THF (25 wt %) and was added to hexane (50 fold excess) to give a light yellow powder that was filtered and dried at 50° C. for 16 hr. Approximately 4.5 g (75% yield) of polymer was isolated (GPC Mw=15800 Mn=7820). The molar ratio of NBPhOH and EPANB was determined to be 83 to 17 by $^1$H NMR. The dissolution rate in 0.26N TMAH of a film of the polymer spun on 4 inch thermal oxide silicon wafer was 880 nm/s.

Example B15

Polymerization and Hydrolysis of NBMMPA/HFANB

NBMMPA (5.00 g, 18.4 mmol) and HFANB (1.26 g, 4.60 mmol) were dissolved in 30.1 g of anhydrous toluene and 5.3 g of MEK and charged to a reaction vessel. The solution was sparged with nitrogen for 30 min to remove oxygen and then heated to 60° C. Once at temperature, NiArf (0.22 g, 0.46 mmol) in 5 g of toluene (prepared in a glove box) was added via syringe to the reaction vessel. The mixture was allowed to stir at 60° C. for 3 h, after which the solution was cooled to room temperature. The solvents were removed from the resulting solution by rotovaporation to give a solid. The solid was redissolved in THF to give a 10 wt % solution. 50 g of 10% concentration KOH aqueous solution was added to the reaction mixture and heated to approximately 80° C. for 8 h. The mixture was then allowed to cool to room temperature and the reaction was confirmed to be complete by IR spectroscopy (absence of carbonyl peaks at ~1730 cm$^{-1}$). The reaction mixture was then treated with acetic acid and formic acid to remove Ni residues and then washed with water/butanol until the pH exceeded four. The solvents were removed by rotovaporation to give a light yellow solid. The yellow solid was redissolved in THF (25 wt %) and was added to hexane (50 fold excess) to give a light yellow powder that was filtered and dried at 50° C. for 16 hr. Approximately 3.7 g (59% yield) of polymer was isolated (GPC Mw=14300 Mn=8790). The molar ratio of NBMMPhOH and HFANB was determined to be 85 to 15 by $^1$H NMR. The dissolution rate in 0.26N TMAH of a film of the polymer spun on 4 inch thermal oxide silicon wafer was zero.

Example B16

Polymerization and Hydrolysis of NBMMPA/EPENB

NBMMPA (5.00 g, 18.4 mmol) and EPENB (0.89 g, 4.59 mmol) were dissolved in 28.4 g of anhydrous toluene and 5.0 g of MEK and charged to a reaction vessel. The solution was sparged with nitrogen for 30 min to remove oxygen and then heated to 60° C. Once at temperature, NiArf (0.22 g, 0.46 mmol) in 5 g of toluene (prepared in a glove box) was added via syringe to the reaction vessel. The mixture was allowed to stir at 60° C. for 3 h, after which the solution was cooled to room temperature. The solvents were removed from the resulting solution by rotovaporation to give a solid. The solid was redissolved in THF to give a 10 wt % solution. 50 g of 10% concentration KOH aqueous solution was added to the reaction mixture and heated to approximately 80° C. for 8 h. The mixture was then allowed to cool to room temperature and the reaction was confirmed to be complete by IR spectroscopy (absence of carbonyl peaks at ~1730 cm$^{-1}$). The reaction mixture was then treated with acetic acid and formic acid to remove Ni residues and then washed with water/Butanol until the pH exceeded four. The solvents were removed by rotovaporation to give a light yellow solid. The yellow solid was redissolved in THF (25 wt %) and was added to hexane (50 fold excess) to give a light yellow powder that was filtered and dried at 50° C. for 16 hr. Approximately 4.1 g (70% yield) of polymer was isolated (GPC Mw=15540 Mn=9190). The molar ratio of NBMMPhOH and deprotected EPANB was determined to be 77 to 23 by $^1$H NMR. The dissolution rate in 0.26N TMAH of a film of the polymer spun on 4 inch thermal oxide silicon wafer was 47 nm/s.

Example B17

Polymerization and Hydrolysis of NBPhOAc/HFANB

NBPhOAc (23.07 g, 101.1 mmol) and HFANB (6.93 g, 25.3 mmol) were dissolved in 54.18 g of toluene and 59.69 g of MEK and charged to a reaction vessel. The solution was sparged with nitrogen for 30 min to remove oxygen and then heated to 60° C. Once at temperature, NiArf (0.612 g, 1.26 mmol) in 5.51 g of anhydrous toluene was added via syringe to the reaction vessel. The reaction mixture was heated to 75° C. immediately after the catalyst addition, and then allowed to stir at 75° C. for 5 h, after which the solution was cooled to room temperature. The reaction mixture was diluted with 120 g of THF. 121.3 g of 10% concentration NaOH aqueous solution was added to the reaction mixture and heated to 60° C. for 4 h. The mixture was then allowed to cool to room temperature and the reaction was confirmed to be complete by IR spectroscopy (absence of carbonyl peaks at ~1730 cm$^{-1}$).

The reaction mixture was then treated with a carboxylic acid and formic acid to remove Ni residues, washed with a mixture of water/methanol/acetone three times, then washed with a mixture of methanol/isopropanol/heptanes three times. PGMEA was then added to the reaction mixture and the residual solvents were removed by rotovaporation to give a 30 wt % polymer solution in PGMEA. Approximately 19.5 g (65% yield) of polymer was recovered (GPC Mw=9776, Mn=5397). The mole ratio of NBPhOH to HFANB was found to be 73:17 by $^1$H NMR. The dissolution rate in 0.26N TMAH of a film of the polymer spun on 4 inch thermal oxide silicon wafer was 220 nm/s.

Example B18

Polymerization and Hydrolysis of NBMMPA/EPENB

NBMMPA (3.00 g, 11.0 mmol) and EPENB (1.05 g, 5.41 mmol), a feed ratio of 67:33, were dissolved in 14.5 g of anhydrous toluene and 3.5 g of MEK and charged to a reaction vessel. The solution was sparged with nitrogen for 30 min to remove oxygen and then heated to 60° C. Once at temperature, NiArf (0.105 g, 0.22 mmol) in 5 g of toluene (prepared in a glove box) was added via syringe to the reaction vessel. The mixture was allowed to stir at 60° C. for 3 h, after which the solution was cooled to room temperature. The solvents were removed from the resulting solution by rotovaporation to give a solid. The solid was redissolved in THF to give a 10 wt % solution. 36 g of 10% concentration KOH aqueous solution were added to the reaction mixture and heated to approximately 80° C. for 8 h. The mixture was then allowed to cool to room temperature and the reaction was confirmed to be complete by IR spectroscopy (absence of carbonyl peaks at ~1730 cm$^{-1}$). The reaction mixture was then treated with a carboxylic acid and formic acid to remove Ni residues and then washed with water/butanol until the pH exceeded four. The solvents were removed by rotovaporation to give a light yellow solid. The yellow solid was redissolved in THF (25 wt %) and was added to hexane (50 fold excess) to give a light yellow powder that was filtered and dried at 50° C. for 16 hr. Approximately 2.9 g (72% yield) of polymer was isolated (GPC Mw=24678 Mn=16012). The dissolution rate in 0.26N TMAH of a film of the polymer spun on 4 inch thermal oxide silicon wafer was 20 nm/s.

Example B19

Polymerization of NBPhOHNBM(PhMeOH)$_2$

NBPhOH (2.10 g, 11.3 mmol) and NBM(PhMeOH)$_2$ (0.40 g, 1.25 mmol), a feed ratio of 90:10, were dissolved in 7.55 g of anhydrous EtOAc and charged to a reaction vessel. The solution was sparged with nitrogen for 30 min to remove oxygen and then heated to 80° C. Once at temperature, NiArf (0.24 g, 0.50 mmol) in 2.46 g of EtOAc (prepared in a glove box) was added via syringe to the reaction vessel. The mixture was allowed to stir at 80° C. for 30 h, after which the solution was cooled to room temperature. The solvents were removed from the resulting solution by rotovaporation to give a solid. The solid was redissolved in THF to give a 10 wt % solution. The reaction mixture was then treated with a peracetic acid solution to remove Ni residues and then washed with water/EtOAc until the pH exceeded four. The solvents were removed by rotovaporation to give a light yellow solid. The yellow solid was redissolved in THF (25 wt %) and was added to hexane (50× by weight) to give a light yellow powder that was filtered and dried at 50° C. for 16 h. Approximately 2.21 g (88%) of polymer was isolated (GPC Mw=17200 Mn=7970). The dissolution rate in 0.26M TMAH was measured as 132 nm/sec.

Example B20

Polymerization of NBPhOH/NBM(PhMeOH)$_2$

NBPhOH (2.11 g, 11.3 mmol) and NBM(PhMeOH)$_2$ (0.40 g, 1.25 mmol), a feed ratio of 90:10, were dissolved in 8.47 g of anhydrous EtOAc and charged to a reaction vessel. The solution was sparged with nitrogen for 30 min to remove oxygen and then heated to 80° C. Once at temperature, NiArf (0.152 g, 0.31 mmol) in 1.54 g of EtOAc (prepared in a glove box) was added via syringe to the reaction vessel. The mixture was allowed to stir at 80° C. for 3.0 h, after which the solution was cooled to room temperature. The solvents were removed from the resulting solution by rotovaporation to give a solid. The solid was redissolved in THF to give a 10 wt % solution. The reaction mixture was then treated with a peracetic acid solution to remove Ni residues and then washed with water/EtOAc until the pH exceeded four. The solvents were removed by rotovaporation to give a light yellow solid. The yellow solid was redissolved in THF (25 wt %) and was added to hexane (50× by weight) to give a light yellow powder that was filtered and dried at 50° C. for 16 h. Approximately 1.75 g (70%) of polymer was isolated (GPC Mw=20200 Mn=10100). The dissolution rate in 0.26M TMAH was measured as 98 nm/sec.

Example B21

Polymerization of NBPhOHlNBM(PhMeOH)$_2$

NBPhOH (1.75 g, 9.39 mmol) and NBM(PhMeOH)$_2$ (0.75 g, 2.40 mmol) were dissolved in 7.70 g of anhydrous EtOAc and charged to a reaction vessel. The solution was sparged with nitrogen for 30 min to remove oxygen and then heated to 80° C. Once at temperature, NiArf (0.23 g, 0.47 mmol) in 2.30 g of EtOAc (prepared in a glove box) was added via syringe to the reaction vessel. The mixture was allowed to stir at 80° C. for 3.0 h, after which the solution was cooled to room temperature. The solvents were removed from the resulting solution by rotovaporation to give a solid. The solid was redissolved in THF to give a 10 wt % solution. The reaction mixture was then treated with a peracetic acid solution to remove Ni residues and then washed with water/EtOAc until the pH exceeded four. The solvents were removed by rotovaporation to give a light yellow solid. The yellow solid was redissolved in THF (25 wt %) and was added to hexane (50× by weight) to give a light yellow powder that was filtered and dried at 50° C. for 16 hr. Approximately 1.66 g, (66%) of polymer was isolated (GPC Mw=15700 Mn=8000). The ratio of NBPhOH to NBM(PhMeOH)$_2$ was determined to be 81 to 19 by $^1$H-NMR. The dissolution rate in 0.26M TMAH was measured as 171 nm/sec.

Example B22

Polymerization of NBPhOH/NBM(PhMeOH)$_2$

NBPhOH (1.75 g, 9.39 mmol) and NBM(PhMeOH)$_2$ (0.75 g, 2.4 mmol), a feed ratio of 80:20, were dissolved in 8.56 g of anhydrous EtOAc and charged to a reaction vessel. The solution was sparged with nitrogen for 30 min to remove oxygen and then heated to 80° C. Once at temperature, NiArf (0.14 g, 0.29 mmol) in 1.44 g of EtOAc (prepared in a glove box) was added via syringe to the reaction vessel. The mixture was allowed to stir at 80° C. for 3.0 h, after which the solution was cooled to room temperature. The solvents were removed from the resulting solution by rotovaporation to give a solid. The solid was redissolved in THF to give a 10 wt % solution. The reaction mixture was then treated with a peracetic acid solution to remove Ni residues and then washed with water/EtOAc until the pH exceeded four. The solvents were removed by rotovaporation to give a light yellow solid. The yellow solid was redissolved in THF (25 wt %) and was added to hexane (50× by weight) to give a light yellow powder that was filtered and dried at 50° C. for 16 hr. Approximately 1.22 g, (49%) of polymer was isolated (GPC Mw=19300 Mn=10100). The dissolution rate in 0.26M TMAH was measured as 111 nm/sec.

Example B23

Polymerization of NBPhOH/NBM(PhMeOH)$_2$

NBPhOH (1.15 g, 6.18 mmol) and NBM(PhMeOH)$_2$ (0.85 g, 2.70 mmol), a feed ratio of 70:30, were dissolved in 7.13 g of anhydrous EtOAc and charged to a reaction vessel. The solution was sparged with nitrogen for 30 min to remove oxygen and then heated to 80° C. Once at temperature, NiArf (0.086 g, 0.18 mmol) in 0.87 g of EtOAc (prepared in a glove box) was added via syringe to the reaction vessel. The mixture was allowed to stir at 80° C. for 16.0 h, after which the solution was cooled to room temperature. The solvents were removed from the resulting solution by rotovaporation to give a solid. The solid was redissolved in THF to give a 10 wt % solution. The reaction mixture was then treated with a peracetic acid solution to remove Ni residues and then washed with water/EtOAc until the pH exceeded four. The solvents were removed by rotovaporation to give a light yellow solid. The yellow solid was redissolved in THF (25 wt %) and was added to hexane (50× by weight) to give a light yellow powder that was filtered and dried at 50° C. for 16 h. Approximately 1.73 g (87%) of polymer was isolated (GPC Mw=47800 Mn=18900). The dissolution rate in 0.26M TMAH was measured as 159 nm/sec.

Example B24

Nitration of NBPhOH

NBPhOH with a molecular weight of 12800 g/mol (10.0 g) was dissolved in 40 ml of acetone and charged to a reaction vessel, to which 6 drops of concentrated H$_2$SO$_4$ was added. The solution was cooled to 0° C. using an ice bath. Once at temperature, 3.75 g concentrated HNO$_3$ in 10 ml acetone was added dropwise over 30 minutes. The reaction mixture was then allowed to warm to room temperature and stirred for 24 hours. The solution was then transferred to a separatory funnel and washed with water/EtOAc until the pH exceeded four. The solvents were removed by rotovaporation to give a light yellow solid. The yellow solid was redissolved in THF (25 wt %) and was added to hexane (50× by weight) to give a light yellow powder that was filtered and dried at 50° C. for 16 hr. Approximately 8.42 g, (85%) of polymer was isolated (GPC Mw=13000 Mn=6190). Approximately 7% of the phenolic rings were determined to have been nitrated by $^1$H NMR. The dissolution rate in 0.26M TMAH of the nitrated NBPhOH was measured as 275 nm/sec while the starting NBPhOH homopolymer was insoluble in TMAH.

Example B25

Homopolymerization of NBE2OHBz

A 10 ml vial was charged with 1.00 g (3.87 mmol) of NBE2OHBz and toluene (4 g, 4.63 ml). A magnetic stir bar was added and the vial was sealed and purged with nitrogen while stirring vigorously. The vial was placed into a heated oil bath at 40° C.; stirring is maintained throughout the reaction. A solution of NiArf was prepared by sealing NiArf (64.5 mg, 133 µmol) into a septum vial in a glove box under nitrogen. The NiArf is then dissolved by the addition of dry ethyl acetate (400 mg, 443 µl) via syringe. Once dissolved the NiArf solution is removed to a syringe and subsequently added to the reaction vial in one portion. Reaction was stirred at 40° C. for 80 min, heating was ceased and the reaction was continued for 100 hours. Reaction mixture was transferred to a vial with 5 ml 2-MeTHF and treated with a 2 ml solution of 1:1:1:1 water, acetic acid, formic acid, and hydrogen peroxide. This was agitated overnight. Reaction was transferred to a separation funnel with 20 ml 2-MeTHF and 5 ml water. The reaction was agitated and allowed to separate. The lower (aqueous) phase was drained, and the organics were washed (5×20 ml water). The organics were recovered, and solvents were removed (dry nitrogen flow, reduced pressure). 0.83 g (83% yield) of the homopolymer was recovered. GPC: Mw 28423, Mn 17747, PD 1.601. An aliquot, 10 mg of the polymer was added to a test tube containing 5 ml TMAH (0.26M) solution. The test tube was sealed and agitated until a clear solution was obtained (approx. 1 hour).

| Polymer Dissolution Rate Table | | | | | |
|---|---|---|---|---|---|
| Example | Polymer | Ratio | Mw | Catalyst | DR (nm/sec) |
| B1 | NBPhOH | 100 | 8310 | Ni | n/a |
| B2 | NBPhOH | 100 | 6300 | Ni | n/a |
| B4b | NBPhOH | 100 | 7140 | Pd | 143 |
| B4 | NBPhOH | 100 | 5400 | Pd | 109 |
| B4a | NBPhOH | 100 | 4400 | Pd | 205* |
| B13 | NB(PhMeOH)$_2$ | 100 | 5350 | Ni | 80 |
| B17 | NBPhOH/HFANB | 73/27 | 9800 | Ni | 220 |
| B3 | NBPhOH/HFANB | 80/20 | 8300 | Ni | not measured |
| B9 | NBPhOH/HFANB | 86/14 | 4820 | Pd | 300 |
| B14 | NBPhOH/EPANB | 83/17 | 15800 | Ni | 880 |
| B8 | NBPhOH/NBMGlyHFP | 88/12 | 23100 | Ni | 300 |
| B11 | NBPhOH/NBMGlyHFP | 82/18 | 10700 | Ni | 272 |
| B6 | NBPhOH/NBMGlyHFP | 91/9 | 7960 | Pd | 252 |
| B5 | NBPhOH/NBMGlyHFP | 93/7 | 7070 | Pd | 112 |

-continued

Polymer Dissolution Rate Table

| Example | Polymer | Ratio | Mw | Catalyst | DR (nm/sec) |
|---|---|---|---|---|---|
| B10 | NBPhOH/NBMMHFP | 86/14 | 4210 | Ni | 223 |
| B23 | NBPhOH/NB(PhMeOH)$_2$ | 70/30 | 47800 | Ni | 159 |
| B20 | NBPhOH/NB(PhMeOH)$_2$ | 90/10 | 20200 | Ni | 78 |
| B22 | NBPhOH/NB(PhMeOH)$_2$ | 80/20 | 19300 | Ni | 111 |
| B19 | NBPhOH/NB(PhMeOH)$_2$ | 90/10 | 17200 | Ni | 132 |
| B21 | NBPhOH/NB(PhMeOH)$_2$ | 81/19 | 15700 | Ni | 171 |
| B12 | NBPhOH/NB(PhMeOH)$_2$ | 89/11 | 13400 | Ni | 228 |
| B7 | NBMMPhOH/NBMGlyHFP | 64/36 | 12400 | Pd | 4.4 |
| B15 | NBMMPhOH/HFANB | 85/15 | 14300 | Ni | 0 |
| B18 | NBMMPhOH/EPANB | 67/33 | 24600 | Ni | 20 |
| B16 | NBMMPhOH/EPANB | 77/23 | 15500 | Ni | 47 |

*post apply bake = 90° C.

The Polymer Dissolution Rate Table shown above is sorted first by polymer type, with the homopolymers listed first (and also sorted by catalyst type), and next by molecular weight (Mw), with the highest values reported first for each polymer type. Looking at Examples B4, B4a and B4b, it can be seen that these homopolymers follow the general rule that as Mw decreases, dissolution rate increase. However, the homopolymers of B1 and B2 are surprising in that no linear dissolution rate (DR) is observed despite the molecular weights (Mw) of B1 and B2 being comparable to the Mw of the B4, B4a and B4b homopolymers. While not wishing to be bound by theory, it seems that polymerization of B1 and B2 using a nickel catalyst as compared to the use of a palladium catalyst for the polymerization of B4, B4a and B4b is the likely cause of this DR difference.

Further, as one looks at several NBPhOH/NBM(PhMeOH)$_2$ polymers it is observed that DR and Mw do not track closely to each other. Specifically, one would expect that B23 having a Mw more than twice that of B20 would have a lower DR, yet the opposite is seen. It is believed that comparing the DR of B20 to B9 demonstrates the effect that the second repeating unit NBM(PhMeOH)$_2$ of the polymer on DR. Thus while the higher Mw of B23 seems to be overcome by the higher concentration of the second repeating unit in B20. The data presented in the table also demonstrates that different second repeating units (HFANB versus EPANB) can have a very strong effect on DR. For example B9 and B14 have about the same ratio of first to second repeating units but while 4 B14 has a Mw about three times higher than that of B9, the DR of 4-2 B14 is almost three times higher than that of B9. Thus embodiments in accordance with the present invention can provide a desired DR by controlling the selection of a polymer's Mw, composition (both the selection of a second repeating unit and the amount of such repeating unit provided in the polymer) and the polymerization catalyst. Finally it should be noted that all of the polymers having an eugenol based first repeating unit demonstrated a significantly lower DR than those having phenol based repeating unit.

C. Formulation and Dissolution Rate Determination Examples

Comparative Example C1

The polymer from Synthesis Example B1 was dissolved in PGME (20 wt %). The polymer solution was spun on 4 inch thermal oxide silicon wafers and soft baked at 130° C. for 2 min to give a polymer film of from about 0.65 to 1.5 microns. The polymer film dissolution rate in 0.26N TMAH (CD-26, Rohm and Haas) was determined using a DRM 420L dissolution rate monitor by Thickness Detection Solutions. The results are given in Table 1 below.

Comparative Example C2

The process of Comparative Example C1 was repeated except that the polymer from Synthesis Example B2 employed. The results are given in Table 1 below.

Example C3

The process of Comparative Example C1 was repeated except that the polymer from Synthesis Example B2 was dissolved in PGME (20 wt %) along with poly(hydroxystyrene) (10 wt % on the polymer, Mw=10,500, Aldrich). The results are given in Table 1 below.

Example C4

The process of Example C3 was repeated except that p-cresol novolak resin (10 wt % on the polymer, Mw=600, Sumitomo Bakelite) was added in place of the poly(hydroxystyrene). The results are given in Table 1 below.

Example C5

The process of Comparative Example C1 was repeated except that the polymer from Synthesis Example B2 was dissolved in PGME/PGMEA 90/10 (20 wt %) along with poly(HFANB) (10 wt % on the polymer, Mw=4270, Promerus, LLC). The results are given in Table 1 below.

Example C6

The process of Example C5 was repeated except that poly (NBMMHFP) (10 wt % on the polymer, Mw=3860, Promerus, LLC) was added in place of the poly(HFANB). The results are given in Table 1 below.

Example C7

The process of Example C6 was repeated except that polymer only 1 wt % on the polymer of poly(NBMMHFP) was added. The results are given in Table 1 below.

Example C8

The process of Comparative Example C1 was followed except that Powderlink 1174 (Cytec Industries, 5 wt % on the polymer) and TAG-382 ([2-(4-methoxy-1-naphthalenyl)-2- oxoethyl]dimethylsulfonium tetrakis(pentafluoro phenyl)borate, CAS #848477-52-1, Toyo Ink, 5 wt % on the polymer) were each added to the polymer solution as individual 5 wt % solutions in PGME. The results are given in Table 1 below.

Example C9

The process of Example C8 was followed except that Hexamethoxymethylmelamine (ICN Biochemicals, 5 wt % on the polymer) was added to the above solution as a 5 wt % solution in PGME instead of the Powderlink 1174 and poly (NBMMHFP) (Mw=3860, Promerus, LLC, 2 wt % in PGMEA) to give 1 wt % on the polymer was additionally added. The results are given in Table 1 below.

Example C10

The process of Example C was followed except that Cymel 301 (Cytec Industries, 5 wt % on the polymer) was added to the above solution as a 5 wt % solution in PGME instead of Hexamethoxymethylmelamine. The results are given in Table 1 below.

Also included in Table 1 is the dissolution rate data reported for the polymer of Example B24. This data was obtained in a manner that was in accordance with the methods described for Examples C1-C10, in that it was dissolved in gamma butyrolactone (GBL) to form a 25% solution, spun onto a 4 inch wafer, and then baked for 2 minutes at 120° C. for 2 min to form a film. It is believed that the remarkable difference in DR from Examples C1 and C2, the unsubstituted analogs, indicate that the incorporation of an electron withdrawing group onto the phenolic ring increases the acidity of the phenol and hence its solubility in an aqueous base such as 0.26N TMAH. It is believed that embodiments in accordance with the present invention can be made incorporating a polymer that encompasses as little as 7% of an electron withdrawing group substituted phenolic repeating unit, will be useful, imageable polymer compositions.

TABLE 1

Dissolution rates of NBPhOH homopolymer in 0.26N TMAH with and without additives.

| Examples | Dissolution Rate (nm/sec) | Observation |
|---|---|---|
| C1 | NA | Film peeled from wafer |
| C2 | NA | Film peeled from wafer |
| C3 | 202 | |
| C4 | 26 | |
| C5 | 367 | |
| C6 | 360 | |
| C7 | 340 | |
| C8 | 415 | |
| C9 | 167 | |
| C10 | 148 | |
| B24 | 275 | ~7% of the rings were nitrated |

With regard to compositions C3-C10, the data provided demonstrates the use of additives to a composition of a NBPhOH homopolymer as a means to control of the dissolution rate (DR) of the film formed therefrom. Thus the difference between the effect of with poly(hydroxystyrene) and novolak additives (both at 10 wt % of the polymer) is readily seen by comparing the DRs of C3 and C4. Similarly, C5 and C6 demonstrate that both polyHFANB and polyNBMMFHP have similar effects when used as a second polymer blended with the first polymer. C7 demonstrates that doubling the concentration of polyNBMMFHP as an additive has essentially no effect on DR. C8 demonstrates that the addition of a crosslinking agent (Powderlink) and a PAG (TAG-382) can, without another other additives, enhance the DR of polyHFANB and finally C9 and C10 demonstrate the effect on DR of the addition of a crosslinking agent, TAG-392 and polyNBMMFHP to a polyHFANB based composition (Hexamethoxymethylmelamine and Cymel 301, respectively). Thus it is readily seen that for embodiments in accordance with the present invention that encompass a base homopolymer, the DR of the resulting film can controlled through the use a second polymer blended with the first polymer as well as through the use of other additives as mentioned above. Further, B24 demonstrates that the DR can be adjusted by providing an electron withdrawing substituent to as little as 7% of the phenol rings in a polymer having a phenolic pendent group.

D. Meyerhofer Plot Determination Examples

The Meyerhofer Plots provided in FIGS. 1-6 were constructed, respectfully, from the data provided in each of Tables 2-7 provided below. The data in these tables were determined using 4" silicon wafers having a thermal oxide-coated surface. The polymer composition indicated for each group of examples were spin-coated onto one of the aforementioned silicon wafers and subsequently soft baked at 130° C. for 2 min to form a film having a thickness of approximately 0.65 microns. After the soft bake, half of each wafer was exposed at 365 nm using an AB-M mask aligner equipped with an i-line band pass filter, while the other half was not exposed. Unless otherwise specifically indicated, the dissolution rate of the polymer films in 0.26 N TMAH (CD-26, Rohm and Haas) was determined, both exposed and unexposed halves, using a Thickness Detection Solutions DRM 420-L dissolution rate monitor having four sensors, two for each half of the wafer. The exposure doses used and the dissolution rates obtained (the average of the two sensor readings) are provided in the aforementioned tables. All weight percent (wt %) values provided below are with respect to the total weight of polymer.

Examples D1

The polymer from Synthesis Example B2 was dissolved in PGME/PGMEA 90/10 (20 wt %) along with poly(HFANB) (10 wt %, Mw=4270, Promerus LLC) and with 0, 5, 10, 15, and 20 wt % SCL6 PAC (on the polymer, from Secant Chemicals).

TABLE 2

Dissolution rates (nm/sec) of NBPhOH homopolymer blended with poly(HFANB) and SCL6 PAC

| Example # | Wt % PAC | DR Unexposed | DR Exposed (exposure dose) |
|---|---|---|---|
| D1a | 0 | 360 | NA |
| D1b | 5 | 117 | 267 (10 J/cm$^2$) |
| D1c | 10 | 32 | 189 (10 J/cm$^2$) |
| D1d | 15 | 4.3 | 136 (10 J/cm$^2$) |
| D1d | 20 | 2.2 | 67 (200 mJ/cm$^2$) |

Example D2

The polymer from Synthesis Example B2 was dissolved in PGME (20 wt %) along with poly(hydroxystyrene) (10 wt %, Mw=10,500, Aldrich) and with 0, 10, and 20 wt % SCL6 PAC (Secant Chemicals).

TABLE 3

Dissolution rates (nm/sec) of NBPhOH homopolymer blended with poly(hydroxystyrene) and SCL6 PAC.

| Example # | Wt % PAC | DR Unexposed | DR Exposed (exposure dose) |
|---|---|---|---|
| D2a | 0 | 202 | NA |
| D2b | 10 | 60 | 327 (200 J/cm2) |
| D2c | 20 | 14 | 245 (200 mJ/cm2) |

Example D3

The polymer from Synthesis Example B2 was dissolved in PGME (20 wt %) along with p-cresol novolak resin (10 wt %, Mw=600, Sumitomo Bakelite) and with 0, 10, and 20 wt % SCL6 PAC (Secant Chemicals).

TABLE 4

Dissolution rates (in CD-26) of NBPhOH homopolymer blended with novolak and SCL6 PAC with and without exposure.

| Example # | Wt % PAC | DR Unexposed | DR Exposed (exposure dose) |
|---|---|---|---|
| D3a | 0 | 26 | NA |
| D3b | 10 | 1.1 | 30 (200 J/cm2) |
| D3c | 20 | 0.4 | 32 (200 mJ/cm2) |

Example D4

The polymer from Synthesis Example B1 was dissolved in PGME (20 wt %) with 1, 10, and 20 wt % SCL6 PAC (Secant Chemicals).

TABLE 5

Dissolution rates (nm/sec) of NBPhOH homopolymer blended with SCL6 PAC.

| Example # | Wt % PAC | DR Unexposed | DR Exposed (exposure dose) |
|---|---|---|---|
| D4a | 1 | 457 | 764 (200 mJ/cm2) |
| D4b | 10 | 136 | 446 (200 mJ/cm2) |
| D4c | 20 | 1.5 | 238 (200 mJ/cm2) |

Example D5

The polymer from Synthesis example B4 was dissolved in PGMEA (20 wt %) along with 0 and 20 wt % SCL6 PAC (Secant Chemicals).

TABLE 6

Dissolution rates (nm/sec) of NBPhOH homopolymer blended with SCL6 PAC

| Example # | Wt % PAC | DR Unexposed | DR Exposed (exposure dose) |
|---|---|---|---|
| D5a | 0 | 109 | NA |
| D5b | 20 | 3.0 | 34 (1 J/cm$^2$) |

Example D6

The polymer from Synthesis example B16 was dissolved in PGMEA (20 wt %) along with 0 and 30 wt % TS-300 PAC.

TABLE 7

Dissolution rates (nm/sec) of NBMMPhOH/EPANB copolymer blended with TS-300 PAC

| Example # | Wt % PAC | DR Unexposed | DR Exposed (exposure dose) |
|---|---|---|---|
| D6a | 0 | 18.8 | NA |
| D6b | 10 | 5.0 | 147.1 (0.6 J/cm$^2$) |
| D6c | 20 | 0.6 | 281.3 (0.6 J/cm$^2$) |
| D6d | 30 | 0.1 | 396.8 (0.6 J/cm$^2$) |

As one of skill in the art can readily observe from the data of Tables 2 through 7, polymer composition embodiments in accordance with the present invention provide imageable films that have high contrast ratios and which are useful for a variety of applications where structures in microelectronic and optoelectronic devices are desired.

E. Imaging Examples

Examples E1-E6 demonstrate positive tone imageability of polymer composition embodiments in accordance with the present invention while Example E7-E9 demonstrates that such compositions can be formulated to provide negative tone imageability where in all cases the images are developed using an aqueous base developer.

Example E1

Figure 7A:
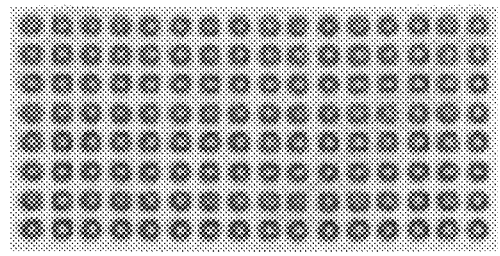
FIGS. 7a and 7b are photomicrographs of 5 micron (μm) vias having a 5 μm pitch and 5 μm lines and spaces in accordance with Imaging Example E1.
Figure 7B:
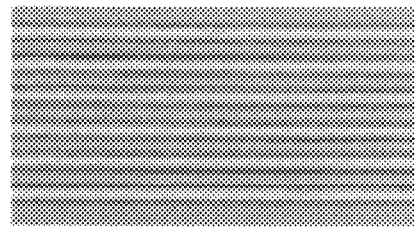

The formulation in Example D4 containing 20% SCL6 was spun onto a thermal oxide silicon wafer, soft baked at 130° C. for 2 min, then exposed at 33 mJ/cm$^2$ through a chrome on glass mask using an AB-M mask aligner at 365 nm using an i-line band pass filter. The wafer was post-exposure baked at 130° C. for 2 min, immersion developed using CD-26 for 10 sec, washed with deionized water while spinning at 500 rpm for 10 see, then spun dry at 2000 rpm for 60 sec. The wafer was post-develop baked at 130° C. for 2 min. The final thickness of the polymer remaining was 0.59 microns. As shown in the photomicrographs below (FIGS. 7a and 7b), good resolution was observed down to at least 5 microns.

Example E2a

The NBPhOH/HFANB polymer from Synthesis Example B3 was dissolved in PGMEA (20 wt %). CEL2021 (Daicel Chemical Industries, 50 wt % on the polymer) and TS-300 (Daitochemix CAS #137902-98-8, 20 wt % on the polymer) were added to the polymer solution and mixed until dissolved. The final solution was spun onto 4 inch thermal oxide silicon wafers and soft baked at 110° C. for 100 seconds to give a polymer film of about 2.7 microns. The film was then exposed at 500 mJ/cm² through a chrome on glass mask using an mask aligner having a broad band Hg vapor light source (g, h and i bands). After exposure, the wafer was post-exposure baked at 100° C. for 30 min, then at 150° C. for an additional 30 min and then at 180° C. for an additional 3 h to obtain a clear film.

Figure 8A:
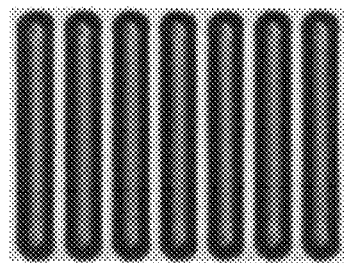
Figure 8B:
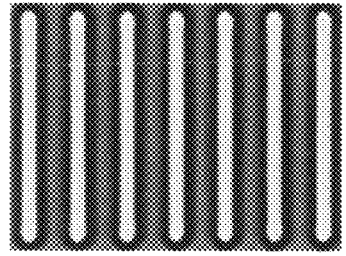
Figure 9A:
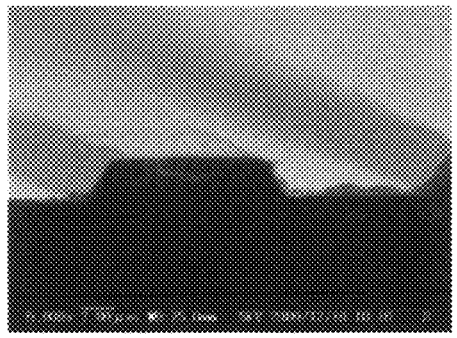
FIGS. 9a, 9b, 9c and 9d are Scanning Electro-Micrographs of cross-sectioned pieces of a patterned wafer made in accordance with Imaging Example E2a, where
Figure 9B:
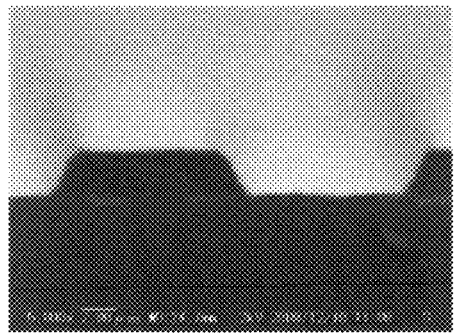
Figure 9C:
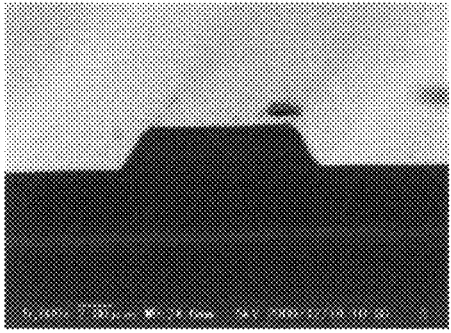
Figure 9D:
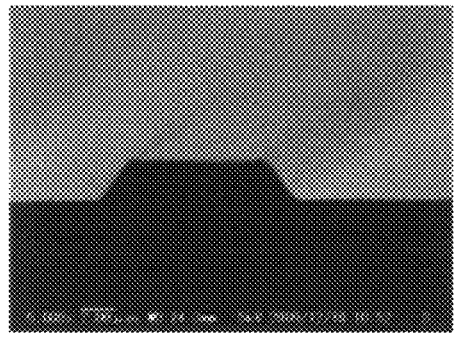

The wafers were then developed by immersing them in a 3.5% TMAH (0.38N) bath for 60 sec, followed by deionized water was while spinning at 500 rpm for 10 sec and subsequently spun dry at 2500 rpm for 30 sec. The final thickness of the polymer was about 2.6 microns. As shown in the photomicrographs below (FIGS. 8a and 8b), good resolution was observed down to at least 5 microns.

Example E2b

The polymer solution used in E2a was also spun onto a glass plate and soft baled soft baked at 110° C. for 100 seconds to give a polymer film of about 3 microns and then treated as above through post-exposure bake to obtain a clear film. Transparency of the film was measures at 400 nm using an ultraviolet-visible spectroscope (Hitachi U-2000) and found to be 91% transparent. Also, water uptake and tolerance to an organic solvent was evaluated by soaking the film in water and toluene for 24 hours. The weight difference before and after soaking was measured and showed a difference of less than 0.1% for both water and toluene.

Example E2c

The dielectric constant of the film was measured (following the technique of JIS-K6911, a Japanese Industrial Standard) using an aluminum plate coated with a film formed using the above described polymer solution. The film thickness was measured using a laser hologram gauge and was found to be about 4.4 microns (the average of three measurements). The dielectric constant and dielectric loss were found to be 2.98 and 0.043, respectively at 1 MHz.

Example E2d

The heat resistance of the polymer film was measured by cutting the glass plate coated with the film into several pieces, heating the pieces to 220° C., 250° C. and 280° C. for 3 minutes on a hot plate, then observing a SEM cross-section of each heated piece. The SEM photos provided below (FIGS. 9a, 9b, 9c, and 9d) show that, in comparison with a piece cross-sectioned just after cure, there is no visible change in the structure's profile thus indicating that the cured polymer film exhibits heat resistance and stability to at least 280° C.

Examples E2 (collectively E2a-E2d) demonstrate that the above described polymer solution a film formulation with high transparency, low dielectric constant, low water uptake, high tolerance to toluene, and good film properties.

Example E3

Figure 10A:
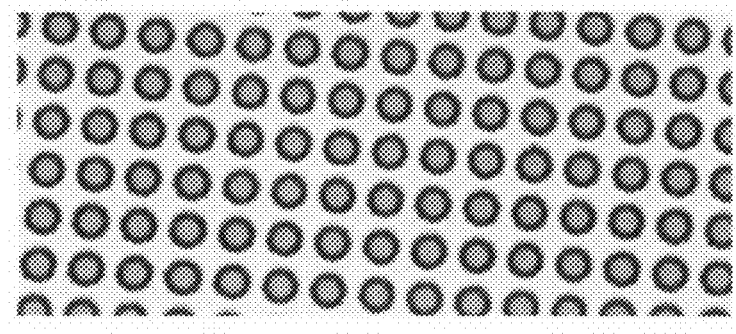
FIGS. 10a and 10b are photomicrographs of 10 micron vias on 10 micron pitch and 10 micron lines/spaces on 20 micron pitch, respectively in accordance with Example E3.
Figure 10B:
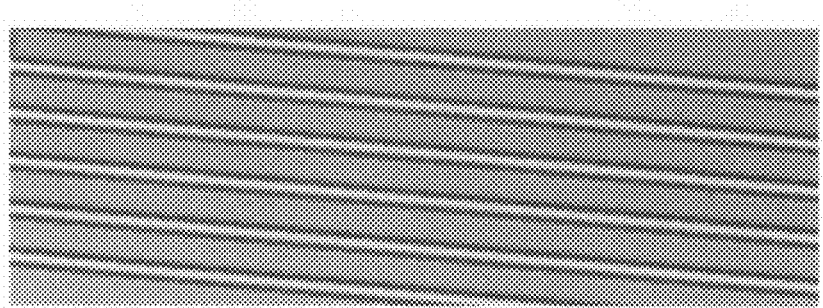

The formulation in example D5 was spun onto a thermal oxide silicon wafer, soft baked at 90° C. for 2 min, then exposed at 1 J/cm² at 365 nm. The wafer was immersion developed using CD-26 for 100 seconds and washed with deionized water. As shown in the photomicrographs below, good resolution was observed down to at least 10 microns, see FIGS. 10a and 10b Example E4

Figure 11:
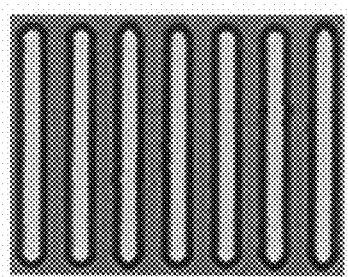
FIG. 11 is a photomicrograph of 5 μm lines and spaces in accordance with Imaging Example E4.

The polymer in example B5 was dissolved in PGMEA (20 wt %) along with 20 wt % of TS-300 PAC and spun onto a thermal oxide silicon wafer, soft baked at 110° C. for 100 seconds, then exposed at 500 mJ/cm² at g, h, i broad band using Canon PLA 501 mask aligner through a chrome on glass mask. The wafer was immersion developed using CD-26 for 150 seconds and washed with deionized water. As shown in the photomicrographs below, good resolution was observed down to at least 5 microns. See FIG. 11.

Example E5

Figure 12:
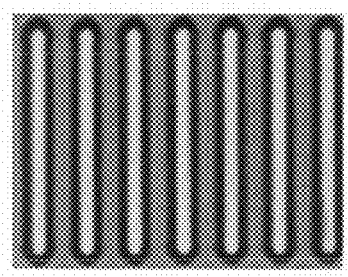
FIG. 12 is a photomicrograph of 5 μm lines and spaces in accordance with Imaging Example E5.

The polymer in example B17 was dissolved in PGMEA (20 wt %) along with 25 wt % of 4NT-300 PAC and spun onto a thermal oxide silicon wafer, soft baked at 110° C. for 100 seconds, then exposed at 500 mJ/cm² at g, h, i broad band using Canon PLA 501 mask aligner through a chrome on glass mask. The wafer was immersion developed using CD-26 for 60 seconds and washed with deionized water. As shown in the photomicrographs below, good resolution was observed down to at least 5 microns. See FIG. 12.

Example E6

Figure 13:
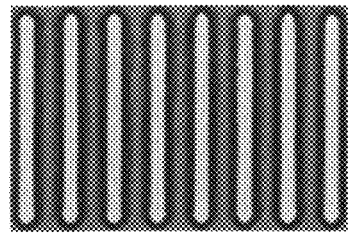
FIG. 13 is a photomicrograph of 5 μm lines and spaces in accordance with Imaging Example E6.

The polymer in example B18 was dissolved in PGMEA (20 wt %) along with 25 wt % of TS-300 PAC and spun onto a thermal oxide silicon wafer, soft baked at 110° C. for 100 seconds, then exposed at 500 mJ/cm² at g, h, i broad band using Canon PLA 501 mask aligner through a chrome on glass mask. The wafer was immersion developed using CD-26 for 150 seconds and washed with deionized water. As shown in the photomicrographs below, good resolution was observed down to at least 5 microns. See FIG. 13.

Example E7

Figure 14:
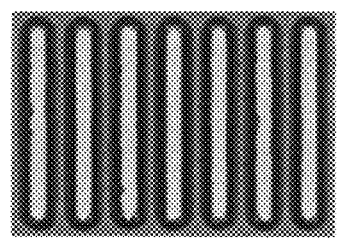
FIG. 14 is a photomicrograph of 5 μm lines and spaces in accordance with negative tone Imaging Example E7.

The polymer in example B18 was dissolved in PGMEA (20 wt %) along with 25 wt % of TMPTGE, 1 wt % of CPTX and 2 phr of Rhodorsil spun onto a thermal oxide silicon wafer, soft baked at 110° C. for 100 seconds, then exposed at 500 mJ/cm² at g, h, i broad band using Canon PLA 501 mask aligner through a chrome on glass mask. Then PEB at 110° C. for 300 seconds. The wafer was immersion developed using 3.5% TMAH aqueous solution for 240 seconds and washed with deionized water. As shown in the photomicrographs below, good resolution was observed down to at least 10 microns. See FIG. 14.

Example E8

Figure 15:
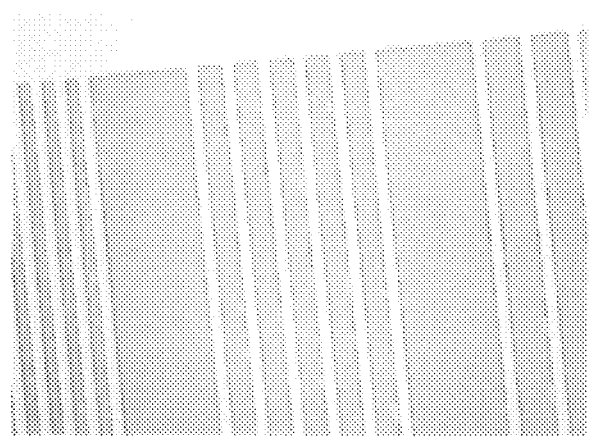
FIG. 15 is a photomicrograph of 10 μm lines and spaces in accordance with negative tone Imaging Example E8.

The polymer in example B18 was dissolved in PGMEA (20 wt %) along with 25 wt % of TMPTGE, 1 wt % of CPTA and 2 phr of Rhodorsil spun onto a thermal oxide silicon wafer, soft baked at 110° C. for 100 seconds, then exposed at 500 mJ/cm² at g, h, i broad band using Canon PLA 501. Then PEB at 110° C. for 300 seconds. The wafer was immersion developed using 3.5% TMAH aqueous solution for 240 seconds and washed with deionized water. As shown in FIG. 15, good resolution was observed down to at least 10 microns.

Example E9

Figure 16:
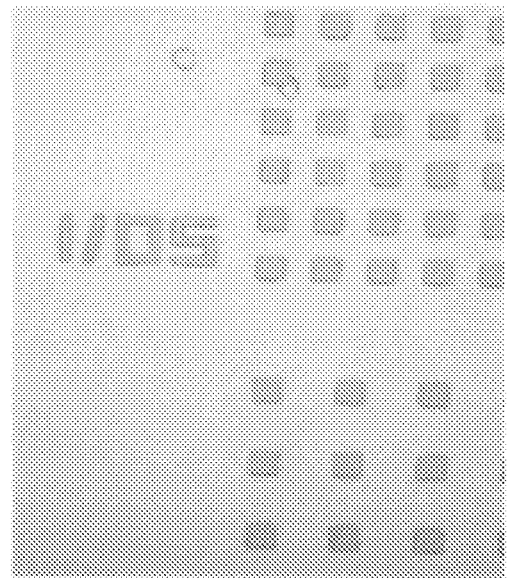
FIG. 16 is a photomicrograph demonstrating the resolution of negative tone Imaging Example E9.

The polymer in example B9 was dissolved in MAK (15 wt %) along with 5 wt % of Powderlink 1174, 5 wt % TAG 382, spun onto a thermal oxide silicon wafer, soft baked at 100° C. for 60 seconds. The wafer was then exposed at 200 mJ/cm² through a negative tone chrome on glass mask using an AB-M mask aligner at 365 nm using an i-line band pass filter, followed by a post exposure bake at 100° C. for 60 sec. The wafer was immersion developed using 0.26N TMAH aqueous solution for 30 seconds and washed with deionized water. Film thickness of the polymer film before and after development was 0.67 microns. As shown in the photomicrograph below, good resolution was observed down to at least 25 microns. See FIG. 16.

Example E10

A NBPhOH/HFANB polymer having a feed ratio of 80/20 was prepared and determined to have a Mw=8200 and a PDI of 1.82. From this polymer two polymer compositions were prepared for imaging tests. Both tested compositions encompassed 100 phr of the polymer 400 phr of the solvent PGMEA and 1.5 phr of triphenyl phosphine (curing agent), while the first tested composition encompassed 20 phr the PAC 4NT-300 and 50 phr of the epoxy CEL 2021 while the second composition encompassed 20 phr of the PAC TS-300 and the 50 phr of the epoxy EHPE 3150.

Figure 17A:
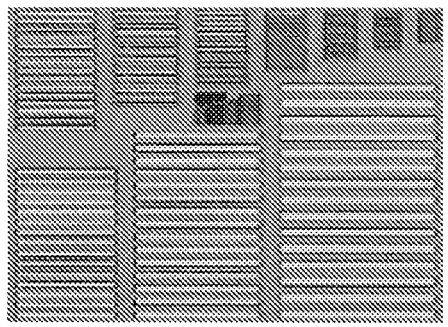
FIGS. 17a-17b and 18a-18b are photomicrographs demonstrating the resolution of the first and second polymer compositions, respectively, of Imaging Example E10.
Figure 17B:
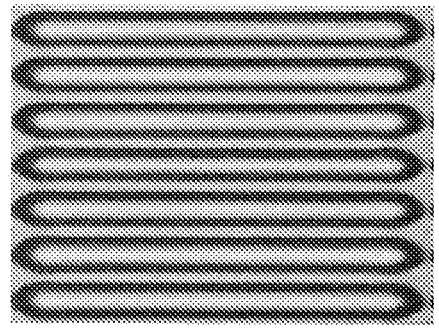
Figure 18A:
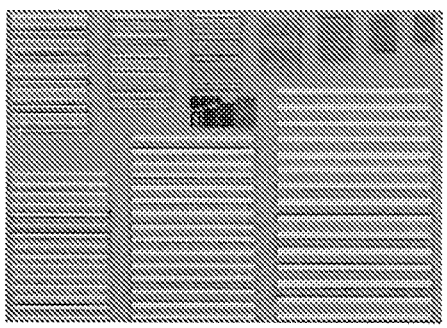
Figure 18B:
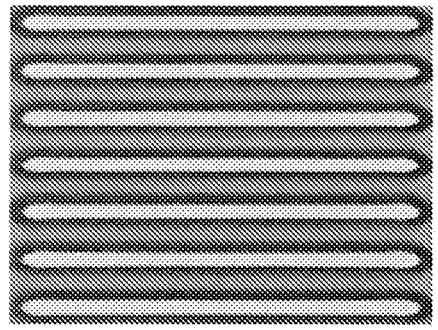

Each solution was cast onto a test wafer by spin coating, pre exposure baked at 110° C. for 100 sec on a hot plate and exposed with 500 mJ/cm2 of the appropriate actinic radiation. After a post exposure bake, the test wafers were developed for 60 seconds in a 3.5% TMAH aqueous solution. The imaging results are seen in FIGS. 17a and 17b for the first composition and 18a and 18b for the second composition.

After a final cure for 3 hours at 180° C., both the first composition and the second were found to demonstrate high transparency (91% at 400 nm), low dielectric constant (2.98 at 1 MHz), low water uptake (<0.01%), high tolerance to toluene (<0.01%) and good film properties (no MURA, no peeling, good adhesion to glass).

By now it will be realized that embodiments in accordance with the present invention are capable of forming self-imageable films that are useful for forming structures in microelectronic and optoelectronic devices. Such embodiments can be both positive-tone or negative-tone compositions that encompass one or more norbornene-type polymers, as have been described hereinabove, and that are aqueous base developable (such as the industry standard 0.26N TMAH).

Further it has been shown that the dissolution rates of films formed from the polymer composition embodiments in accordance with the present invention can be controlled by a variety of methods, including among others, employing polymer blends, varying the ratio of repeating units within polymers having more than one type of repeating unit, the use of solubility additives such as PACs, PAGs, novolak and PHS resins, crosslinking agents and the like.

What is claimed is:
1. A film forming polymer composition comprising:
a first polymer comprising repeating units derived from one or more monomers selected from:

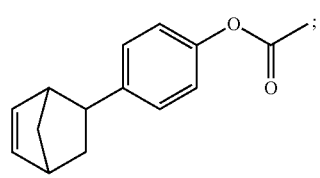

4-(bicyclo[2.2.1]hept-5-en-2-yl)phenyl acetate

-continued

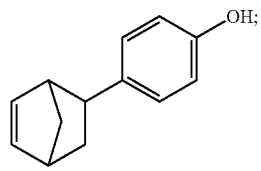

4-(bicyclo[2.2.1]hept-5-en-2-yl)phenol

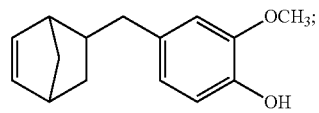

4-(bicyclo[2.2.1]hept-4-en-2-ylmethyl)-2-methoxyphenol

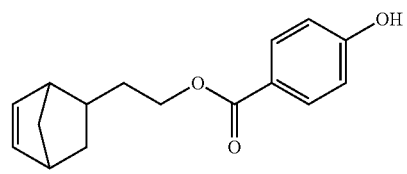

2-(bicyclo[2.2.1]hept-5-en-2-yl)ethyl 4-hydroxybenzoate

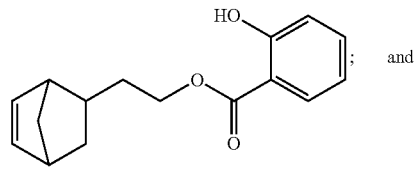

2-(bicyclo[2.2.1]hept-5-en-2-yl)ethyl 4-hydroxybenzoate; and

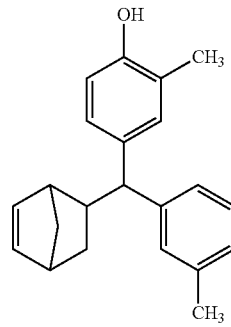

4,4'-(bicyclo[2.2.1]hept-5-en-2-ylmethylene)bis(2-methylphenol)

a second polymer blended with said first polymer, said second polymer comprising repeating units derived from a monomer selected from:

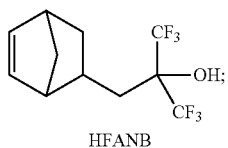
HFANB

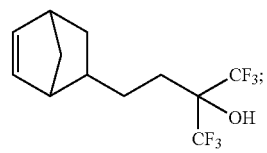
HFACH$_2$NB

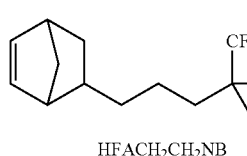
HFACH$_2$CH$_2$NB

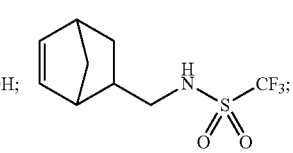
TFSNB

-continued

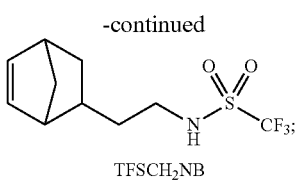
TFSCH₂NB

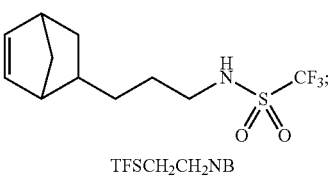
TFSCH₂CH₂NB

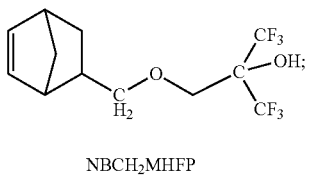
NBCH₂MHFP

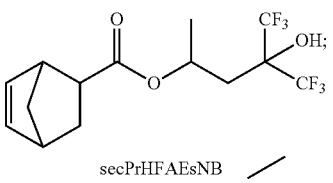
secPrHFAEsNB

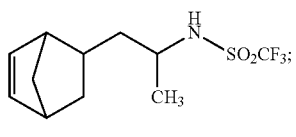
TFSsecPrNB

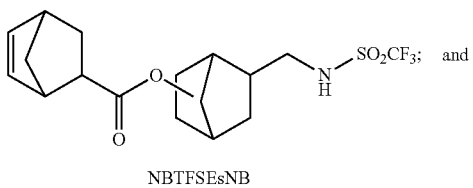
NBTFSEsNB and

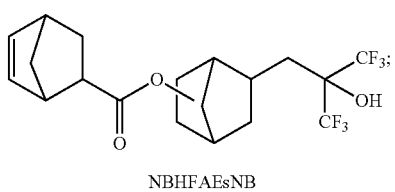
NBHFAEsNB a casting solvent; and
a diazo quinone photo active compound.

2. The polymer composition of claim 1, where said first polymer comprises repeating units derived from 4-(bicyclo[2.2.1]hept-5-en-2-yl)phenyl acetate or 4-(bicyclo[2.2.1]hept-5-en-2-yl)phenol.

3. The polymer composition of claim 1, where said first polymer is a homopolymer.

4. The polymer composition of claim 3, where said second polymer comprises repeating units derived from 2-(bicyclo[2.2.1]hept-5-en-2-ylmethyl)-1,1,1,3,3,3-hexafluoropropan-2-ol (HFANB).

5. The polymer composition of claim 1, where said second polymer comprises repeating units derived from at least one of 2-(bicyclo[2.2.1]hept-5-en-2-ylmethyl)-1,1,1,3,3,3-hexafluoropropan-2-ol (HFANB), 2-((bicyclo[2.2.1]hept-5-en-2-yloxy)methyl)-1,1,1,3,3,3-hexafluoropropan-2-ol (NBMMHFP) and N-(bicyclo[2.2.1]hept-5-en-2-ylmethyl)-1,1,1-trifluoromethanesulfonamide (TFSNB).

6. The polymer composition of claim 1, further comprising a solubility additive.

7. The polymer composition of claim 6, where the solubility additive comprises poly(hydroxystyrene).

8. The polymer composition of claim 6, where said solubility additive comprises a novolak.

9. The polymer composition of claim 1, where the photo active compound is selected from:

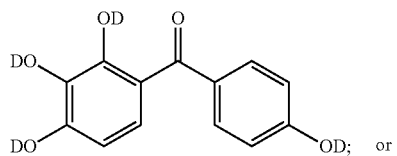 or

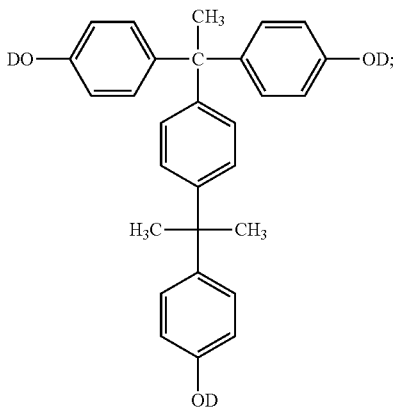

where at least one of D is:

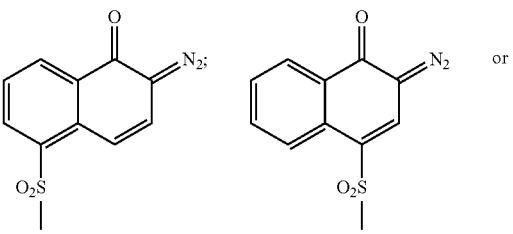

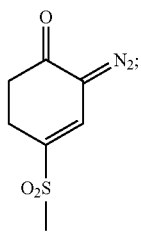

and the remaining D is hydrogen.

10. The polymer composition of claim 9, further comprising an epoxy additive of the formula:

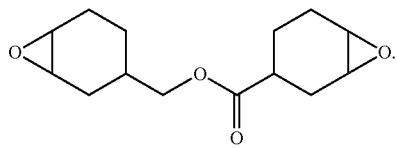 [SMILES: O=C(OCC1CCC2OC2C1)C1CCC2OC2C1]

11. A method of forming a microelectronic or optoelectronic structure, comprising:
   coating a microelectronic or optoelectronic substrate with the polymer composition of claim 9 to form a film;
   imagewise exposing said film to actinic radiation;
   treating said exposed film with an aqueous base developer; and
   curing said imaged film to form said structure.

12. A film forming composition for forming a film having at least one of a transparency of at least 85% at 400 nm, a dielectric constant of 3 or less at 1 MHz, a water uptake of 0.1% or less, or a tolerance to toluene of 0.1% or less, comprising:
   a first polymer comprising repeating units derived from 4-(bicyclo[2.2.1]hept-5-en-2-yl)phenol and 2-(bicyclo[2.2.1]hept-5-en-2-ylmethyl)-1,1,1,3,3,3-hexafluoropropan-2-ol;
   a casting solvent;
   a diazo quinone photoactive compound; and
   an epoxy compound.

13. The film forming composition of claim 12 where the epoxy compound is selected from:

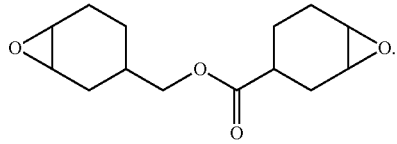 [SMILES: O=C(OCC1CCC2OC2C1)C1CCC2OC2C1]

14. The film forming composition of claim 12, where the photoactive compound is selected from:

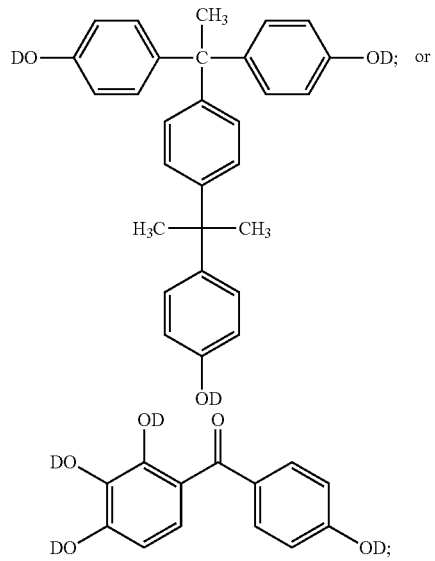

where at least one of D is:

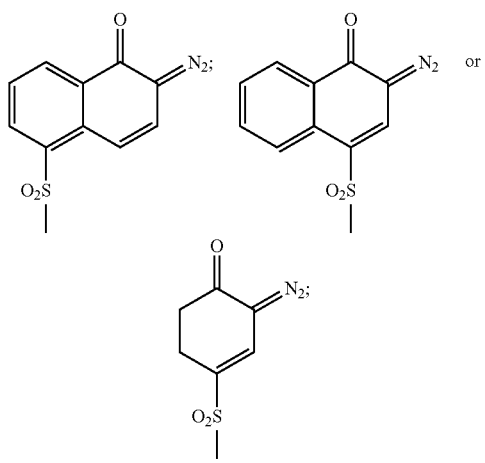

and the remaining D is hydrogen.

* * * * *